United States Patent
Toshima et al.

(12)

(10) Patent No.: US 6,817,790 B2
(45) Date of Patent: Nov. 16, 2004

(54) SUBSTRATE PROCESSING METHOD AND SUBSTRATE PROCESSING APPARATUS

(75) Inventors: Takayuki Toshima, Nirasaki (JP); Takehiko Orii, Nirasaki (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 10/653,999

(22) Filed: Sep. 4, 2003

(65) Prior Publication Data

US 2004/0042790 A1 Mar. 4, 2004

Related U.S. Application Data

(62) Division of application No. 09/801,918, filed on Mar. 9, 2001, now Pat. No. 6,634,806.

(30) Foreign Application Priority Data

Mar. 13, 2000 (JP) .......... 2000-068121
Mar. 30, 2000 (JP) .......... 2000-092660

(51) Int. Cl.$^7$ .......... G03D 5/00
(52) U.S. Cl. .......... 396/604; 396/611; 396/627; 118/52; 427/240
(58) Field of Search .......... 396/604, 611, 396/627; 118/52, 319–321; 430/5, 30; 427/240

(56) References Cited

U.S. PATENT DOCUMENTS 5,854,953 A * 12/1998 Semba .......... 396/611

* cited by examiner

Primary Examiner—D. Rutledge
(74) Attorney, Agent, or Firm—Oblon, Spivak, McClelland, Maier & Neustadt, P.C.

(57) ABSTRACT

On the occasion of developing processing, a mixed solution produced by stirring a developing solution and a solution with a specific gravity smaller than the developing solution is supplied to the front surface of a substrate and left as it is for a fixed period of time. After the mixed solution is separated into two layers of which the lower layer is the developing solution and the upper layer is the solution, developing progresses all at once in the entire surface of the substrate. Hence, time difference in start time of developing does not occur in the surface of the substrate, thereby enabling uniform developing and an improvement in line width uniformity of a resist pattern film in the surface of the substrate.

18 Claims, 22 Drawing Sheets

SUBSTRATE PROCESSING METHOD AND SUBSTRATE PROCESSING APPARATUS

This application is a division of 09/801,918 filed Mar. 9, 2001, now U.S. Pat No. 6,634,806.

BACKGROUND OF THE INVENTION

1. Field of the Invention

The present invention relates to a developing method for developing an exposure pattern after a resist film formed on a substrate such as a semiconductor wafer, an LCD substrate, or the like is exposed in accordance with a predetermined pattern.

Moreover, the present invention relates to a substrate processing apparatus for applying a processing solution such as a developing solution, a cleaning solution, or the like on the front surface of a substrate to be processed such as a semiconductor wafer.

2. Description of the Related Art

In a coating and developing processing system for a photolithography process in processes of semiconductor device fabrication, for example, resist coating processing for forming a resist film on the front surface of a semiconductor wafer and developing processing for developing the semiconductor wafer after the resist-coated semiconductor wafer is subjected to exposure processing are performed.

In the developing processing, the wafer which is exposed in accordance with a predetermined pattern and subjected to post-exposure bake processing and cooling processing is carried into a developing unit to be mounted on a spin chuck. A developing solution is supplied from a developing solution supply nozzle and applied (heaped up) so as to have a thickness of 1 mm, for example, on the entire surface of the semiconductor wafer, and thus a developing solution puddle is formed. The wafer remains stationary for a predetermined period of time with the developing solution puddle being formed, and developing processing progresses by natural convection. Thereafter, the developing solution is thrown out by the rotation of the semiconductor wafer by means of the spin chuck, and then a rinse solution is discharged from a rinse solution supply nozzle to rinse away the developing solution remaining on the wafer. Subsequently, the spin chuck is rotated at a high speed, whereby the developing solution and the rinse solution remaining on the semiconductor wafer are thrown out, and the wafer is dried. Thus, successive developing processing is completed, and a resist pattern film is formed.

When the developing solution puddle is formed in this developing processing, nozzles of various shapes are used for applying the developing solution on the entire surface of the semiconductor wafer, and the wafer is rotated and the nozzle is scan-moved while the developing solution is being discharged from the nozzle.

In the aforesaid conventional developing method, however, the time to heap up the developing solution, impact at the time of supply of the developing solution, displacement speed of the developing solution, and the like are uneven in the surface of the semiconductor wafer by any means when the developing solution puddle is formed on the semiconductor wafer, thereby making it difficult to obtain the uniformity of line width of the resist pattern film. Moreover, defects are prone to occur due to entry of bubbles in heaping up the solution and the like.

Recently, with high integration of devices from 64 Mbits to 256 Mbits, it is increasingly demanded to scale down circuit patterns, and the minimum line width almost reaches a super-submicron region of not more than 0.2 $\mu$m. In order to meet the demand, a chemically amplified resist is used as a resist capable of microfabrication, but the chemically amplified resist has poor wettability for the developing solution, so that the aforesaid defects are prone to occur. When microfabrication is performed with the chemically amplified resist, the ununiformity of line width due to the aforesaid unevenness becomes remarkable because the chemically amplified resist has extremely high sensitivity to the developing solution.

SUMMARY OF THE INVENTION

An object of the present invention is to provide a substrate processing method and a substrate processing apparatus capable of uniformly performing predetermined processing with a solution on a substrate.

Another object of the present invention is to provide a substrate processing method and a substrate processing apparatus in each of which line width can be made uniform in developing processing and defects do not tend to occur during the coating of the developing solution.

To solve the aforesaid problems, the present invention is a substrate processing method for performing predetermined processing for a front surface of a substrate by at least one of a first solution and a second solution having a specific gravity smaller than the first solution, comprising the steps of: (a) supplying a mixed solution in which the first solution and the second solution are mixed onto the substrate; and (b) leaving the substrate to which the mixed solution is supplied as it is at least until the mixed solution is separated into the first solution and the second solution on the substrate.

Moreover, the present invention is a substrate processing method for developing an exposure pattern after a resist film formed on a substrate is exposed in accordance with a predetermined pattern characterized by comprising the steps of: stirring a developing solution and a solution with a specific gravity smaller than the developing solution; and supplying the stirred developing solution and solution onto the exposed resist film on the substrate and leaving them as they are.

According to such structures, in the developing processing, the mixed solution produced by stirring the developing solution and the solution with the specific gravity smaller than the developing solution is supplied to the front surface of the substrate, whereby immediately after the supply of the mixed solution, a chemical reaction between the developing solution and the resist hardly ever occurs, and developing does not progress practically. Then, the mixed solution is left as it is for a fixed period of time after being supplied onto the wafer W, and thereby the mixed solution is separated into two layers of which the lower layer is the developing solution and the upper layer is the solution. In this point of time, the developing solution is completely spread uniformly over the entire surface of the wafer W, and developing progresses under this situation. Thus, the developing progresses on the entire surface of the wafer W all at once. As a result, time difference in start time of developing does not occur in the surface of the wafer W, thereby enabling uniform developing and an improvement in line width uniformity (CD value uniformity) of a resist pattern film in the surface of the wafer W.

A substrate processing apparatus of the present invention comprises: a holder for holding a substrate; and a nozzle for supplying a mixed solution in which a first solution and a second solution with a specific gravity smaller than the first solution are mixed onto the held substrate.

Moreover, a substrate processing apparatus of the present invention is characterized by comprising: a mounting table on which a substrate on which an exposure pattern is formed after a resist film is exposed in accordance with a predetermined pattern is horizontally held with the exposure pattern facing upward; and a mixed solution storage vessel for stirring a developing solution and a solution having a specific gravity smaller than the developing solution which are to be supplied to the substrate and storing them.

According to such apparatus of the present invention, in the developing processing, the mixed solution produced by stirring the developing solution and the solution with the specific gravity smaller than the developing solution is supplied to the front surface of the substrate. As a result, immediately after the supply of the mixed solution, a chemical reaction between the developing solution and the resist hardly ever occurs, and developing does not progress practically. Then, the mixed solution is left as it is for a fixed period of time after being supplied onto the wafer W, and thereby the mixed solution is separated into two layers of which the lower layer is the developing solution and the upper layer is the solution. In this point of time, the developing solution is completely spread uniformly over the entire surface of the wafer W, and developing progresses under this situation. Thus, the developing progresses on the entire surface of the wafer W all at once. As a result, time difference in start time of developing does not occur in the surface of the wafer W, thereby enabling uniform developing and an improvement in line width uniformity (CD value uniformity) of a resist pattern film in the surface of the wafer W.

A substrate processing apparatus of the present invention according to another aspect comprises: a holder for holding a substrate; a first nozzle for supplying a first solution onto the held substrate; a second nozzle for supplying at least one of a second solution and a gas onto the held substrate; and a moving mechanism for moving a supply position of the first nozzle and moving the second nozzle so that the first solution which has been just supplied from the first nozzle is removed by at least one of the second solution and the gas supplied from the second nozzle.

Moreover, a substrate processing apparatus of the present invention is characterized by comprising: a substrate holding mechanism for horizontally holding a substrate; a rotating mechanism for rotating the substrate in a horizontal plane; a processing solution supply nozzle moving along a direction, in which an outer edge portion and a central portion of the substrate are linked, to supply a processing solution onto the substrate while the substrate is being rotated by the rotating mechanism; and a rinse solution supply nozzle, disposed adjacent to the processing solution supply nozzle so as to be positioned in a spreading direction of the processing solution supplied onto the substrate, for supplying a rinse solution onto the substrate simultaneously with the supply of the processing solution.

According to such structures of the present invention, the processing solution which has been just dropped from the processing solution supply nozzle is new and a region into which the processing solution has been dropped is processed by the new processing solution. This solution used for processing is spread by the rotation of the substrate, but this used solution which is spread is immediately removed by the rinse solution supplied from the rinse solution supply nozzle. Therefore, the new processing solution is always supplied to the entire surface of the substrate, and the processing solution with high processing capability is supplied onto the entire surface of the substrate. Consequently, unevenness of processing is eliminated in the entire surface of the substrate, resulting in efficient processing.

A substrate processing apparatus of the present invention is characterized by comprising: a substrate holding mechanism for horizontally holding a substrate; a rotating mechanism for rotating the substrate in a horizontal plane; a processing solution supply nozzle moving along a direction, in which an outer edge portion and a central portion of the substrate are linked, to supply a processing solution onto the substrate while the substrate is being rotated by the rotating mechanism; and a rinse solution supply nozzle for supplying a rinse solution for removing the used processing solution after the processing solution supplied onto the substrate is used for processing onto the substrate simultaneously with the supply of the processing solution.

According to such a structure of the present invention, the processing solution which has been just dropped from the processing solution supply nozzle is new and a region into which the processing solution has been dropped is processed by the new processing solution. Since this solution used for processing is immediately removed by the rinse solution, the new processing solution is always supplied to the entire surface of the substrate, and thus the processing solution with high processing capability is supplied onto the entire surface of the substrate. Consequently, unevenness of processing is eliminated in the entire surface of the substrate, resulting in efficient processing.

A substrate processing method of the present invention comprises the steps of: moving a supply position while supplying a first solution onto a substrate; and supplying at least one of a second solution and a gas immediately after the supplied first solution so as to remove the supplied first solution.

Furthermore, the present invention is a substrate processing method comprising the steps of: rotating a substrate which is horizontally held; and supplying a processing solution and a rinse solution from a processing solution supply nozzle and a rinse solution supply nozzle respectively to the substrate while moving the processing solution supply nozzle and the rinse solution supply nozzle along a direction in which an outer edge portion and a central portion of the substrate are linked, characterized in that the rinse solution supply nozzle is positioned in a direction in which the processing solution supplied onto the substrate spreads.

According to such structures of the present invention, the processing solution which has been just dropped from the processing solution supply nozzle is new and a region into which the processing solution has been dropped is processed by the new processing solution. This solution used for processing is spread by the rotation of the substrate, but this used solution which is spread is immediately removed by the rinse solution supplied from the rinse solution supply nozzle. Therefore, the new processing solution is always supplied to the entire surface of the substrate, and the processing solution with high processing capability is supplied onto the entire surface of the substrate. Consequently, unevenness of processing is eliminated in the entire surface of the substrate, resulting in efficient processing.

A substrate processing method of the present invention is characterized by comprising the steps of: rotating a substrate which is horizontally held; and supplying a processing solution and a rinse solution from a processing solution supply nozzle and a rinse solution supply nozzle respectively to the substrate while moving the processing solution supply nozzle and the rinse solution supply nozzle along a direction in which an outer edge portion and a central portion of the substrate are linked, wherein the rinse solution removes the used processing solution after the processing solution supplied onto the substrate is used.

According to such a structure of the present invention, the processing solution which has been just dropped from the processing solution supply nozzle is new and a region into which the processing solution has been dropped is processed by the new processing solution. Since this solution used for processing is immediately removed by the rinse solution, the new processing solution is always supplied to the entire surface of the substrate, and thus the processing solution with high processing capability is supplied onto the entire surface of the substrate. Consequently, unevenness of processing is eliminated in the entire surface of the substrate, resulting in efficient processing.

These objects and still other objects and advantages of the present invention will become apparent upon reading the following specification when taken in conjunction with the accompanying drawings.

DETAILED DESCRIPTION OF THE PREFERRED EMBODIMENT

Embodiments of the present invention will be described in detail below with reference to the accompanying drawings.

Figure 1:
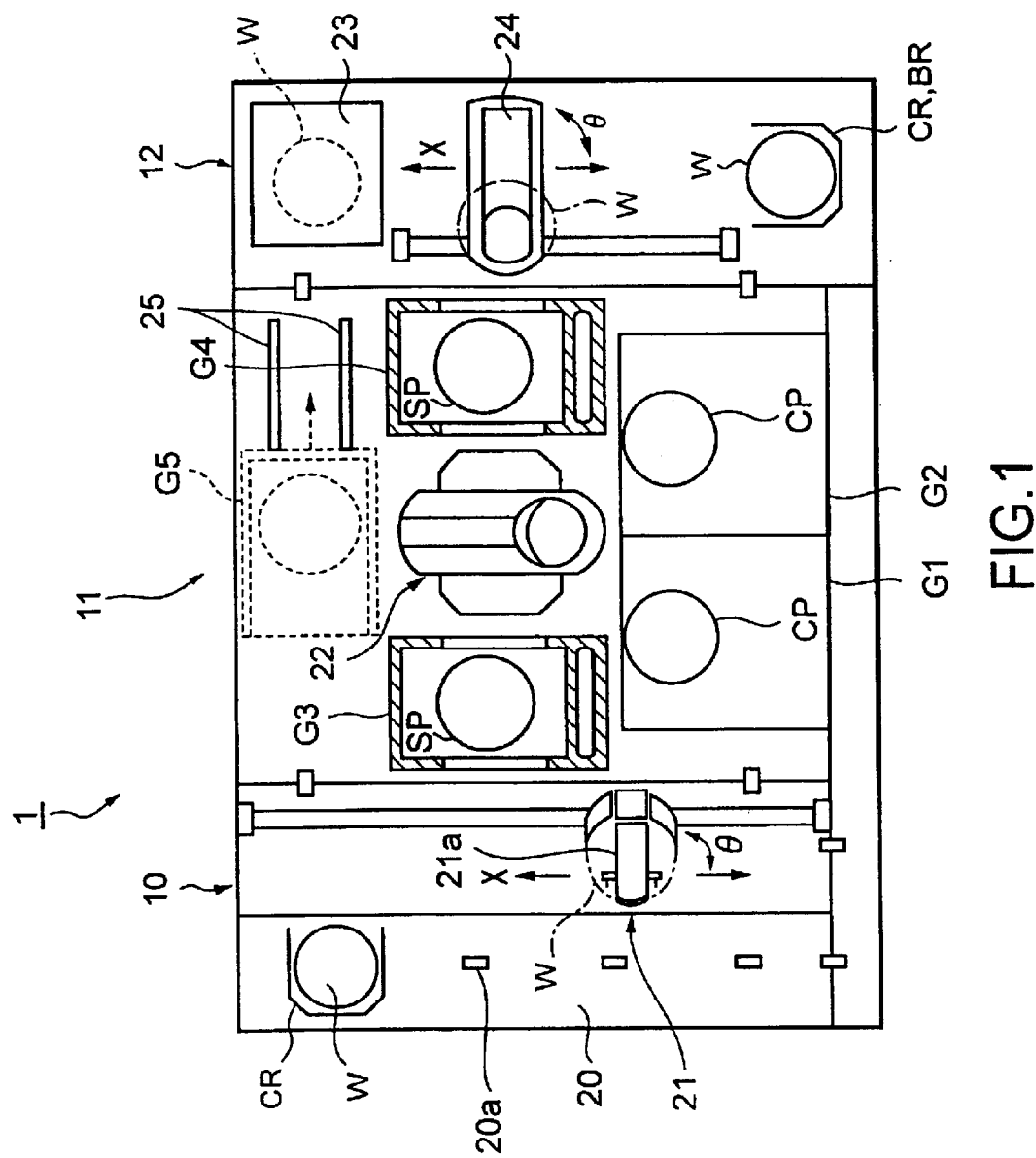
FIG. 1 is a schematic plane view showing a resist coating and developing processing system used for putting the present invention into practice.
Figure 2:
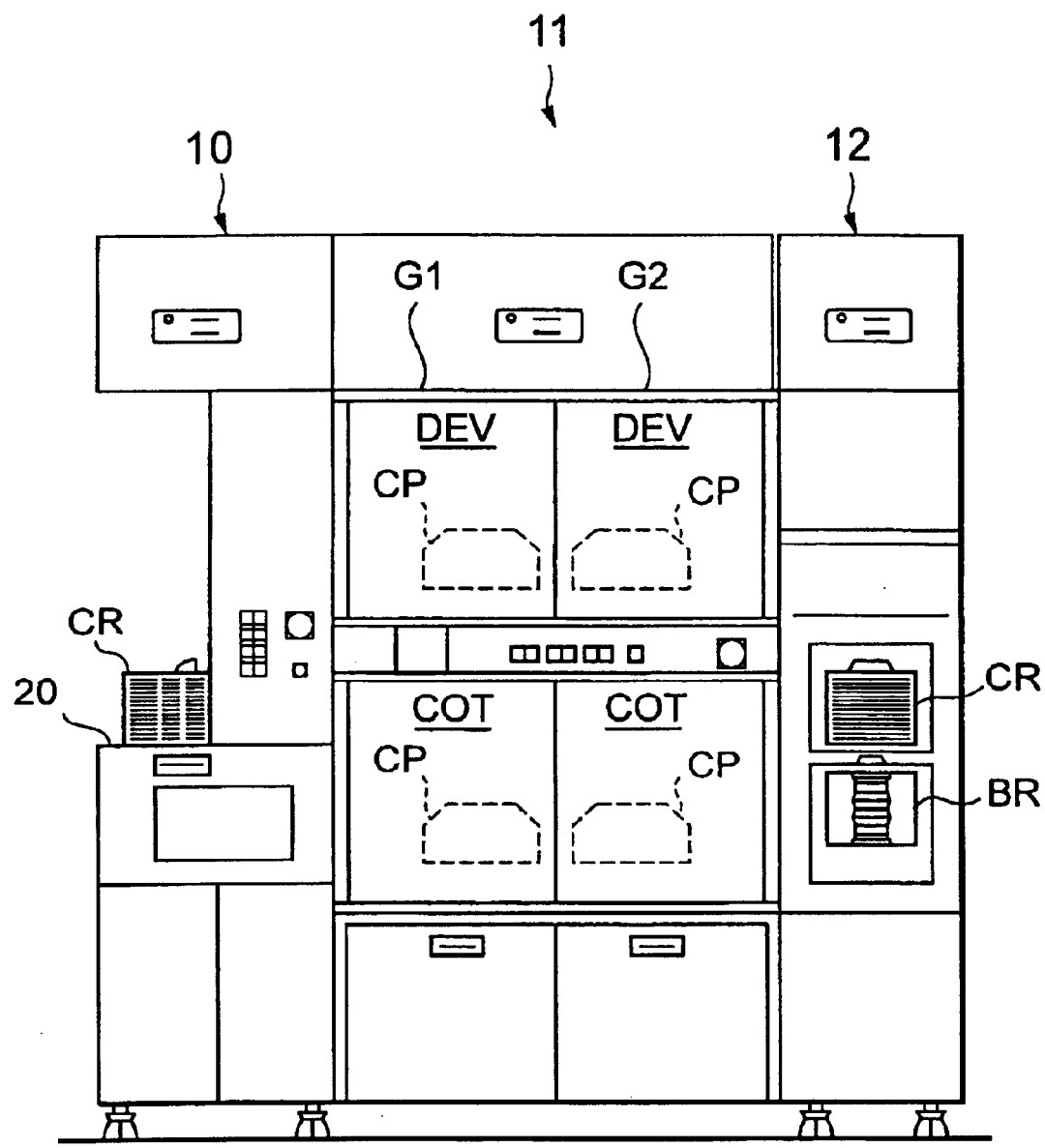
FIG. 2 is a side view showing the resist coating and developing processing system in FIG. 1.
Figure 3:
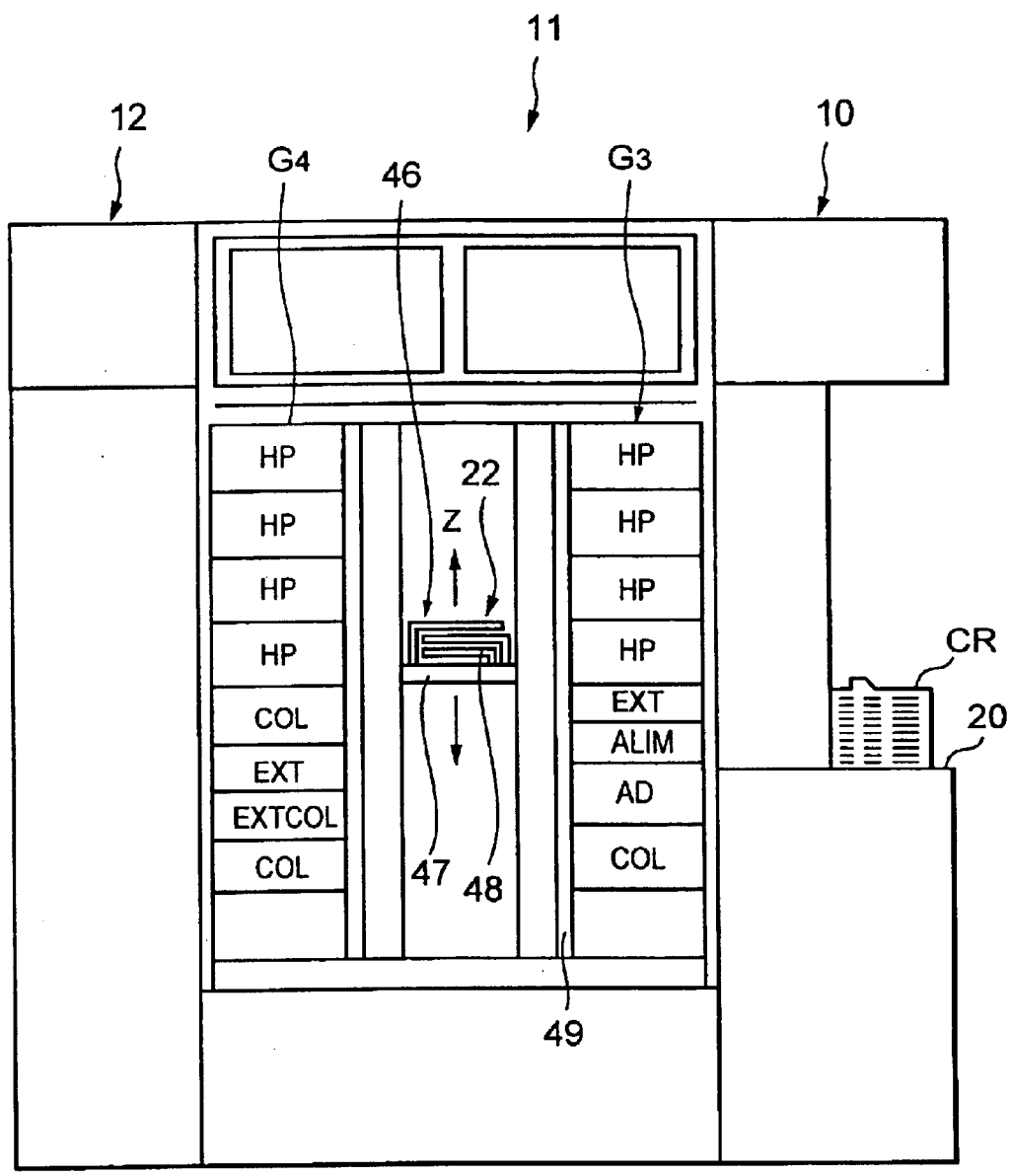
FIG. 3 is a rear view showing the resist coating and developing processing system in FIG. 1.

FIG. 1 is a schematic plan view showing a resist coating and developing processing system used for putting the present invention into practice;, FIG. 2 is a front view of FIG. 1, and FIG. 3 is a rear view of FIG. 1.

This processing system 1 includes a cassette station 10 being a transfer station, a processing station 11 having a plurality of processing units, and an interface section 13 for receiving and sending a wafer W from/to an aligner (not illustrated) provided adjacent to the processing station 11.

The aforesaid cassette station 10 is to carry a plurality of, for example, 25 semiconductor wafers W (hereinafter referred to only as wafers W) as objects to be processed, as a unit, housed in a wafer cassette CR from a different system into this system or from this system into the different system, and transfer the wafer W between the wafer cassette CR and the processing station 11.

In this cassette station 10, as shown in FIG. 1, a plurality of (four in FIG. 1) positioning projections 20a are formed on a cassette mounting table 20 along an X-direction in FIG. 1, and the wafer cassettes CR can be mounted in a line with respective wafer transfer ports facing the processing station 11 side at the positions of the projections 20a. In the wafer cassette CR, the wafers W are arranged in a vertical direction (a Z-direction). Moreover, the cassette station 10 has a wafer transfer mechanism 21 situated between the wafer cassette mounting table 20 and the processing station 11. This wafer transfer mechanism 21 has a wafer transfer arm 21a which is movable in the direction of arrangement of cassettes (the X-direction) and the direction of arrangement of the wafers W housed in the cassette (the Z-direction), and can selectively get access to any of the wafer cassettes CR by the transfer arm 21a. The wafer transfer arm 21a is structured to be rotatable in a θ-direction so as to be able to get access to an alignment unit (ALIM) and an extension unit (EXT) both included in a third processing section $G_3$ on the processing station 11 side which will be described later.

The processing station 11 includes a plurality of processing units for carrying out a series of processes when coating and developing are performed for the wafer W. These units are stacked in multiple tiers at predetermined positions, and the wafers W are processed one by one by these units. As shown in FIG. 1, the processing station 11 has a transfer path in the middle thereof, a main wafer transfer mechanism 22 is provided in the transfer path, and all the processing units are arranged around the wafer transfer path. The plurality of processing units are divided into a plurality of processing sections, and a plurality of processing units are stacked in multiple tiers along the vertical direction in each of the processing sections.

As shown in FIG. 3, the main wafer transfer mechanism 22 includes a wafer transfer device 46 which is ascendable and descendable in the vertical direction (the Z-direction) within a cylindrical supporter 49. The cylindrical supporter 49 is rotatable by rotational driving force of a motor (not illustrated), and the wafer transfer device 46 is also rotatable integrally with the cylindrical supporter 49.

The wafer transfer device 46 includes a plurality of holding members 48 which are movable in the forward and backward directions of a transfer base 47, and carries out the delivery of the wafer W between the processing units by using these holding members 48.

As shown in FIG. 1, in this embodiment, four processing sections $G_1$, $G_2$, $G_3$, and $G_4$ are actually arranged around the wafer transfer path, and a processing section $G_5$ can be disposed as required.

Out of these sections, the first and second processing sections $G_1$ and $G_2$ are arranged side by side on the front side of the system (on the lower side in FIG. 1), the third processing section $G_3$ is arranged adjacent to the cassette station 10, and the fourth processing section $G_4$ is arranged adjacent to the interface section 12. Moreover, the fifth processing section $G_5$ can be arranged on the rear side.

In this case, as shown in FIG. 2, in the first processing section $G_1$, two spinner-type processing units each for performing predetermined processing for the wafer W while the wafer W is mounted on a spin chuck (not illustrated) inside a cup CP are vertically two-tiered. In this embodiment, a resist coating unit (COT) for coating the wafer W with a resist and a developing unit (DEV) for developing a pattern of the resist are two-tiered from the bottom in order. Similarly, in the second processing section $G_2$, a resist coating unit (COT) and a developing unit (DEV) as two spinner-type processing units are two-tiered from the bottom in order.

The reason why the resist coating unit (COT) or the like is disposed on the lower tier side is that drainage of a resist solution is essentially more complex in terms of both mechanism and maintenance than that of a developing solution, and that the complexity is mitigated by disposing the resist coating unit (COT) or the like at the lower tier as described above. It is possible, however, to arrange the resist coating unit (COT) or the like at the upper tier as required.

As shown in FIG. 3, in the third processing section $G_3$, oven-type processing units each for performing predetermined processing for the wafer W while the wafer W is placed on a mounting table SP are staked in multiple tiers. Namely, a cooling unit (COL) for performing cooling processing, an adhesion unit (AD) for performing so-called hydrophobic processing to enhance the adhesion of the resist, an alignment unit (ALIM) for performing alignment, an extension unit (EXT) for carrying the wafer W in and out, and four hot plate units (HP) for performing heat processing for the wafer W before and after exposure processing and after developing processing are eight-tiered from the bottom in order.

Also in the fourth processing section $G_4$, oven-type processing units are stacked in multiple tiers. More specifically, a cooling unit (COL), an extension and cooling unit (EXTCOL) which is a wafer carrying in/out section provided with a chill plate, an extension unit (EXT), a cooling unit (COL), and four hot plate units (HP) are eight-tiered from the bottom in order.

The above arrangement of the cooling unit (COL) and the extension and cooling unit (EXTCOL) each having a low processing temperature at the lower tiers and the heat processing units (HP) each having a high processing temperature at the upper tiers can reduce thermal mutual interference between units. Random multi-tiered arrangement is naturally suitable.

As described above, the fifth processing section $G_5$ can be provided on the rear side of the main wafer transfer mechanism 22. When the fifth processing unit group $G_5$ is provided, it can be moved along guide rails 25 laterally as seen from the main wafer transfer mechanism 22. Accordingly, even when the fifth processing section $G_5$ is provided, a spatial portion is secured by sliding the fifth processing section $G_5$ along the guide rails 25, so that maintenance operations for the main wafer transfer mechanism 22 can be easily performed from the back thereof. In this case, a space can be secured not only by moving the fifth processing unit group $G_5$ linearly, but also by turning it. Incidentally, a processing section having a structure in which oven-type processing units are stacked in multiple tiers basically likewise with the third and fourth processing sections $G_3$ and $G_4$ can be used as the fifth processing section $G_5$.

The aforesaid interface section 12 has the same length as the processing station 11 in a depth direction (the X-direction). As shown in FIG. 1 and FIG. 2, a transportable pickup cassette CR and a fixed-type buffer cassette BR are two-tiered at the front of the interface section 12, a peripheral edge aligner 23 is disposed at the rear, and a wafer carrier 24 is disposed at the center. The wafer carrier 24 moves in the X-direction and the Z-direction to be able to get access to both the cassettes CR and BR, and the peripheral edge aligner 23. Moreover, the wafer carrier 24 is rotatable in the θ-direction to be able to get access to the extension unit (EXT) included in the fourth processing section $G_4$ in the processing station 11 and a wafer delivery table (not illustrated) on the adjoining aligner side.

Figure 4:
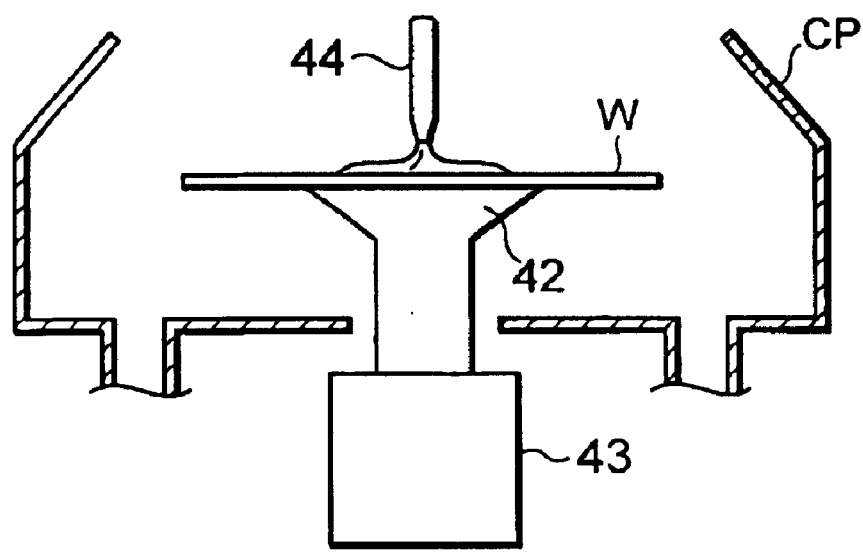
FIG. 4 is a sectional view showing a resist coating unit used in the system in FIG. 1.

As shown in FIG. 4, the resist coating unit (COT) has a cup CP, a spin chuck 42 for horizontally suction-holding the wafer W inside the cup CP, a motor 43 for rotating the spin chuck 42, and a nozzle 44 for supplying a coating solution such as a resist solution. The spin chuck 42 and the suction-held wafer W are rotated by the motor 43 while the resist solution is supplied to the center of the wafer W from the nozzle 44, whereby the resist solution is spread over the entire surface of the wafer W to form a resist film. Also, it is suitable to use a nozzle of great width and apply the resist solution by scan-moving the nozzle. In this embodiment, a chemically amplified resist with a novolac resin as its main component is used as a resist material.

Figure 5:
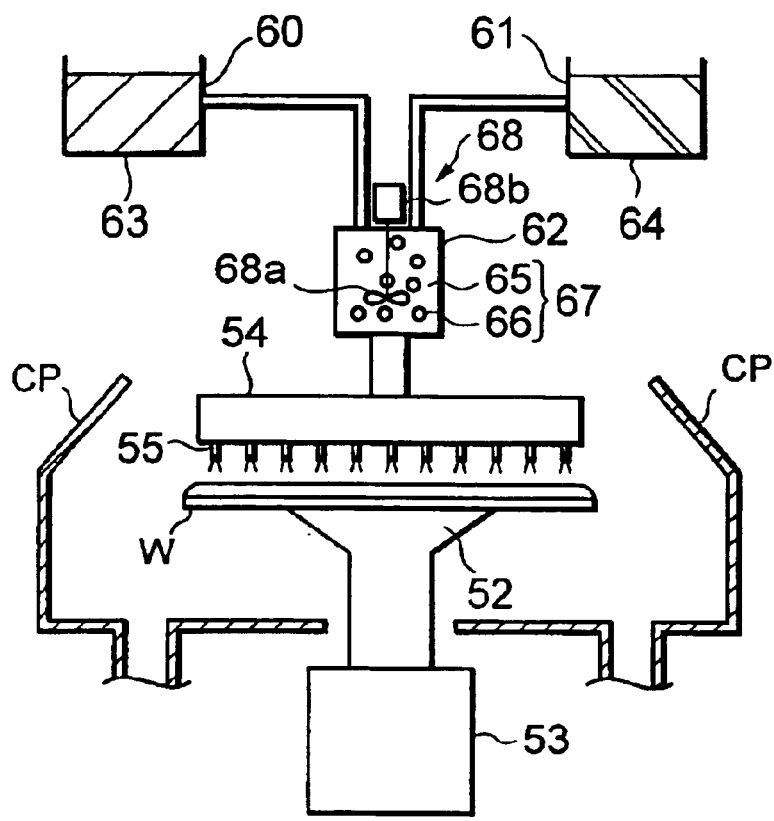
FIG. 5 is a sectional view showing a developing unit used in the system in FIG. 1.

As shown in FIG. 5, the developing unit (DEV) has a cup CP, a spin chuck 52 as a mounting table for horizontally suction-holding the wafer W with the exposure pattern facing upward, a motor 53 for rotating the spin chuck 52, and a nozzle 54 for supplying a mixed solution of a developing solution and a solution. This nozzle 54 has almost the same width as the wafer W, and many developing solution discharge portions 55 are provided over the entire width of the bottom portion thereof. By rotating the spin shuck 52 and the suction-held wafer W one full turn by means of the motor 53 while supplying the mixed solution of the developing solution and the solution from the discharge portions 55 of the nozzle 54, a developing solution puddle is formed on the wafer W. The nozzle 54 communicates with a mixed solution storage vessel 62 for storing a mixed solution 67 to be supplied to the wafer W. A developing solution 63 stored in a developing solution storage vessel 60 and a solution 64, which has a smaller specific gravity than the developing solution, stored in a solution storage vessel 61 are respectively supplied into the mixed solution storage vessel 62. In the mixed solution storage vessel 62, a stirring mechanism 68 including a propeller 68a and a motor 68b for rotating the propeller 68a is provided, and the developing solution and the solution are stirred and mixed uniformly within the mixed solution storage vessel 62. In the mixed solution 67 stored in the mixed solution storage vessel 62, bubbles 66 of the developing solution are evenly dispersed in a solution 65, and the mixed solution in such a state is supplied onto the wafer W. In this embodiment, TMAH (tetramethyl ammonium hydroxide) is used as the developing solution, and HMDS is used as the solution. In this embodiment, as will be described later, the mixed solution 67 is separated into two layers of which the lower layer is the developing solution and the upper layer is the solution by leaving the mixed solution 67 as it is for a fixed period of time after supplying it onto the wafer W. Moreover, a rinse nozzle not illustrated is provided in the developing unit (DEV), and after the developing solution is thrown out by the rotation of the wafer W after the completion of developing, a rinse solution is discharged from the rinse nozzle to rinse away the developing solution remaining on the wafer W. Incidentally, when the developing solution puddle is formed, the nozzle 54 may be scan-moved.

Next, a series of processing operations including a developing method in this embodiment will be explained by using the system structured as above.

First, in the cassette station 10, the wafer transfer arm 21a of the wafer transfer mechanism 21 gets access to the cassette CR housing unprocessed wafers W on the cassette mounting table 20 and takes one wafer W out of the cassette CR. The wafer W is transferred to the extension unit (EXT), and thence carried into the processing station 11 by the transfer device 46 of the main wafer transfer mechanism 22. Subsequently, after being aligned in the alignment unit (ALIM) included in the processing section $G_3$, the wafer W is subjected to adhesion processing in the adhesion unit (AD) disposed thereunder.

The wafer W which has undergone the adhesion processing is cooled in any one of the cooling units (COL) of the third and fourth processing sections $G_3$ and $G_4$, and then the resist is applied in the coating unit (COT) of the processing section $G_1$ or $G_2$ in the aforesaid procedure. Subsequently, after undergoing pre-bake processing in any one of the hot plate units (HP) of the processing sections $G_3$ and $G_4$, the wafer W is cooled in any one of the cooling units (COL).

Thereafter, the wafer W is transferred to the interface section 12 via the extension unit (EXT) of the fourth processing section $G_4$ by the wafer transfer device 46 of the main transfer mechanism 22 after being aligned in the alignment unit (ALIM) of the third processing section $G_3$.

In the interface section 12, peripheral edge exposure by the peripheral edge aligner 23 is performed, and thereafter the wafer W is transferred to the adjoining aligner (not illustrated), where exposure processing is performed for the resist film of the wafer W in accordance with a predetermined pattern, and an exposure pattern is formed.

After the exposure processing is completed, the wafer W is transferred to the extension unit (EXT) included in the fourth processing section $G_4$ by means of the wafer carrier 24 in the interface section 12 and thence carried into the processing station 11 by the transfer device 46 of the main wafer transfer mechanism 22. The wafer W is then transferred to any one of the hot plate units (HP) of the third and fourth processing sections $G_3$ and $G_4$ to undergo post-exposure bake processing, and cooled in any one of the cooling units (COL).

The wafer W which has undergone the post-exposure bake processing as described above is transferred to any one of the developing units (DEV) of the first and second processing sections $G_1$ and $G_2$ to be subjected to developing.

Figure 6A:
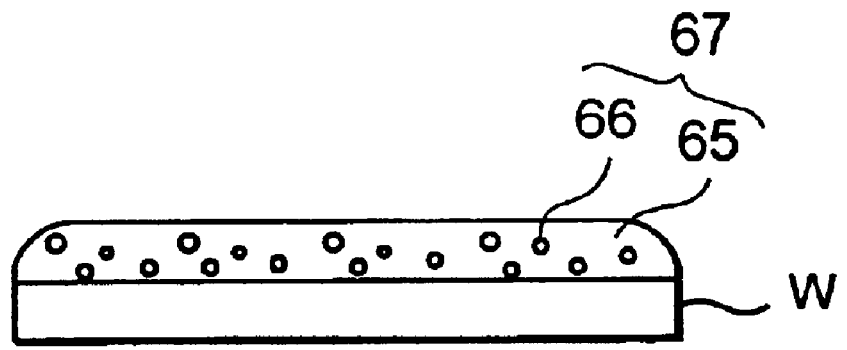
FIGS. 6A and 6B are views showing states of a mixed solution of a developing solution and a solution supplied onto a wafer W in developing processing according to one embodiment of the present invention.
Figure 6B:
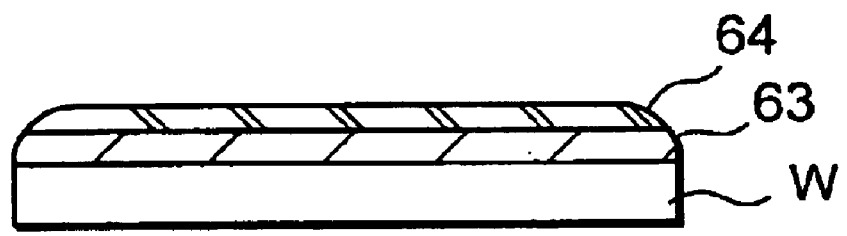

In the developing process, as shown in FIG. 5, the TMAH and the HMDS are supplied from the developing solution storage vessel 60 and the solution storage vessel 61 into the mixed solution storage vessel 62, for example, so that their mixture ratio is six to four. The TMAH and the HMDS supplied into the mixed solution storage vessel 62 are stirred and mixed uniformly. This mixed solution 67 is in a state in which the bubbles 66 of the TMAH are evenly dispersed in the HMDS 65, and as shown in FIG. 6, immediately after the mixed solution 67 is supplied onto the wafer W, the mixed solution in the state in which the bubbles 66 of the TMAH are evenly dispersed in the HMDS 65 is supplied onto the entire surface of the wafer W. In such a state, a chemical reaction between the developing solution and the resist hardly ever occurs, and developing does not progress practically. Accordingly, even if the supplied mixed solution is ununiform in the surface of the wafer W, developing never progresses partially. Thereafter, as shown in FIG. 6B, by leaving the mixed solution 67 as it is, for example, for 20 seconds to 40 seconds, the mixed solution 67 is separated into two layers of which the lower layer is the TMAH as the developing solution and the upper layer is the HMDS as the solution. In this point of time, the developing solution completely spreads uniformly over the entire surface of the wafer W, and developing progresses under this situation. Thus, the developing progresses in the entire surface of the wafer W all at once. As a result, time difference in start time of developing does not occur in the surface of the wafer W, thereby enabling uniform developing and an improvement in line width uniformity (CD value uniformity) of a resist pattern film in the surface of the wafer W. Further, since the developing progresses all at once after the mixed solution of the developing solution and the solution is applied and left as it is for the fixed period of time, the time to heap up the developing solution is not restricted. Hence, in place of the aforesaid nozzle 54, a simpler nozzle can be used, and coating by a method other than the method using the nozzle is also possible.

After the developing process is completed in the aforesaid manner, the wafer W is subjected to post-bake processing in any one of the hot plate units (HP), and then cooled in any one of the cooling units (COL), and the resist pattern film is formed. Thereafter, the wafer W is mounted on a mounting table of the extension unit (EXT) by the transfer device 46 of the main wafer transfer mechanism 22 in the processing station 11. The wafer W on the mounting table is received by the arm 21a of the wafer transfer mechanism 21 of the cassette station 10 and inserted into a predetermined wafer storage slot of the cassette CR for storing processed wafers on the cassette mounting table 20. Thus, successive processing is completed.

It should be noted that the present invention is not limited to the aforesaid embodiment and can be modified variously. For example, since developing progresses all at once and the time to heap up the developing solution is not restricted as described above, the type of the developing solution nozzle is not limited to the aforesaid type, and any type of nozzle such as a straight type nozzle and a slit-type nozzle can be used, and other methods such as a method by a roll coater and the like can be used.

Although the chemically amplified resist with the novolac resin as its main component as the resist material, the TMAH as the developing solution, and the HMDS as the solution are used in this embodiment, they are not limited to these materials. As the solution having a specific gravity smaller than the developing solution, at least one of activators such as dimethylsilane and dimethylamido in addition to the HMDS (hexamethyldisilazane) can be used. As the solution, it is preferable to use a solution which has a specific gravity smaller than the developing solution, does not chemically react with the resist, does not cause chemical change to the developing solution by mixture, and has high dispersibility in mixture.

Although the chemically amplified resist is used as the resist in the aforesaid embodiment, it is needless to say that other resist materials also can obtain the same effects. When the chemically amplified resist is used as the resist material, however, the chemically amplified resist has poor wettability for the developing solution, so that a defect that the line width of a resist pattern film is ununiform is prone to occur. But, by using the developing method of the present invention, a resist pattern film of which the line width is uniform in the surface of the wafer W can be obtained even if the chemically amplified resist with extremely high sensitivity is used as the resist material.

In the aforesaid embodiment, the developing solution and the solution are stored in the separate storage vessels, and predetermined amounts of developing solution and solution are supplied from the respective storage vessels to the mixed solution storage vessel and stirred to produce the mixed solution, whereby it is possible to regulate a mixture ratio and the like depending on a change in processing situation on the occasion of developing processing.

Figure 7:
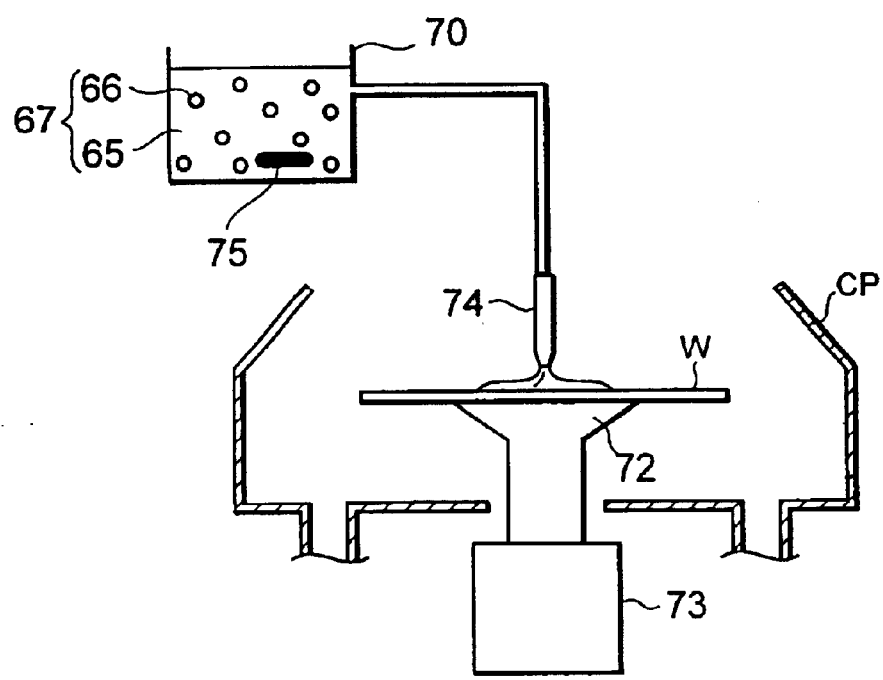
FIG. 7 is a sectional view showing another developing unit.

As shown in FIG. 7, it is suitable to provide a mixed solution storage vessel 70 for previously storing the mixed solution 67 with a predetermined mixture ratio instead of storing the developing solution and the solution in the separate storage vessels. Incidentally, in FIG. 7, the mixed solution is supplied to the central portion of the wafer W from a nozzle and spread over the entire surface of the wafer W by spin-coating. In FIG. 7, a cup CP, a spin chuck 72 for horizontally suction-holding the wafer W inside the cup CP, a motor 73 for rotating the spin chuck 72, and a nozzle 74 for supplying the mixed solution are provided. The spin chuck 72 and the suction-held wafer W are rotated by the motor 73 while the mixed solution 67 from the mixed solution storage vessel 70 is supplied from the nozzle 74 to the central portion of the wafer W, whereby the mixed solution 67 is spread over the entire-surface of the wafer W. Also in this case, a magnetic stirrer 75 is provided as a stirring mechanism in the mixed solution storage vessel 70, and the developing solution and the solution are stirred and mixed by this stirring mechanism. Incidentally, it is naturally suitable to provide the aforesaid stirring mechanism having the propeller and the like.

Figure 8:
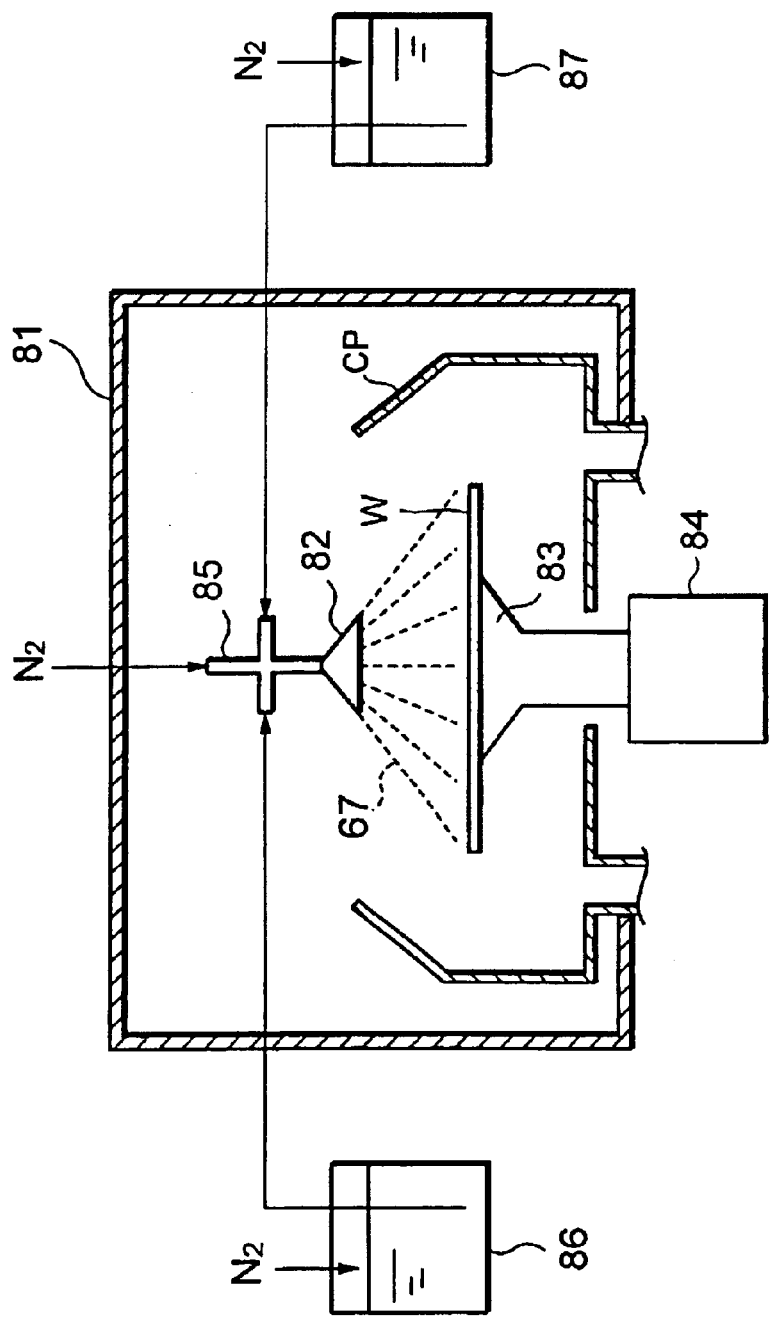
FIG. 8 is a sectional view showing still another developing unit.

Moreover, as shown in FIG. 8, it is suitable to provide the developing unit according to the present invention inside a chamber 81 and to use a shower-type nozzle 82 as a developing solution nozzle. The mixed solution 67 is supplied to the entire surface of the wafer W by the nozzle 82 while a spin chuck 83 which holds the wafer W is rotated by the motor 84, for example. In this case, for example, a mixer 85 may communicate with the nozzle 82, the developing solution and the solution may be pressed into the mixer 85 respectively from a developing solution storage vessel 86 and a solution storage vessel 87 by using an inert gas, for example, N2 gas, and the mixed solution 67 may be pressed from the mixer 85 to the nozzle 82 by the inert gas, for example, the N2 gas.

Figure 9:
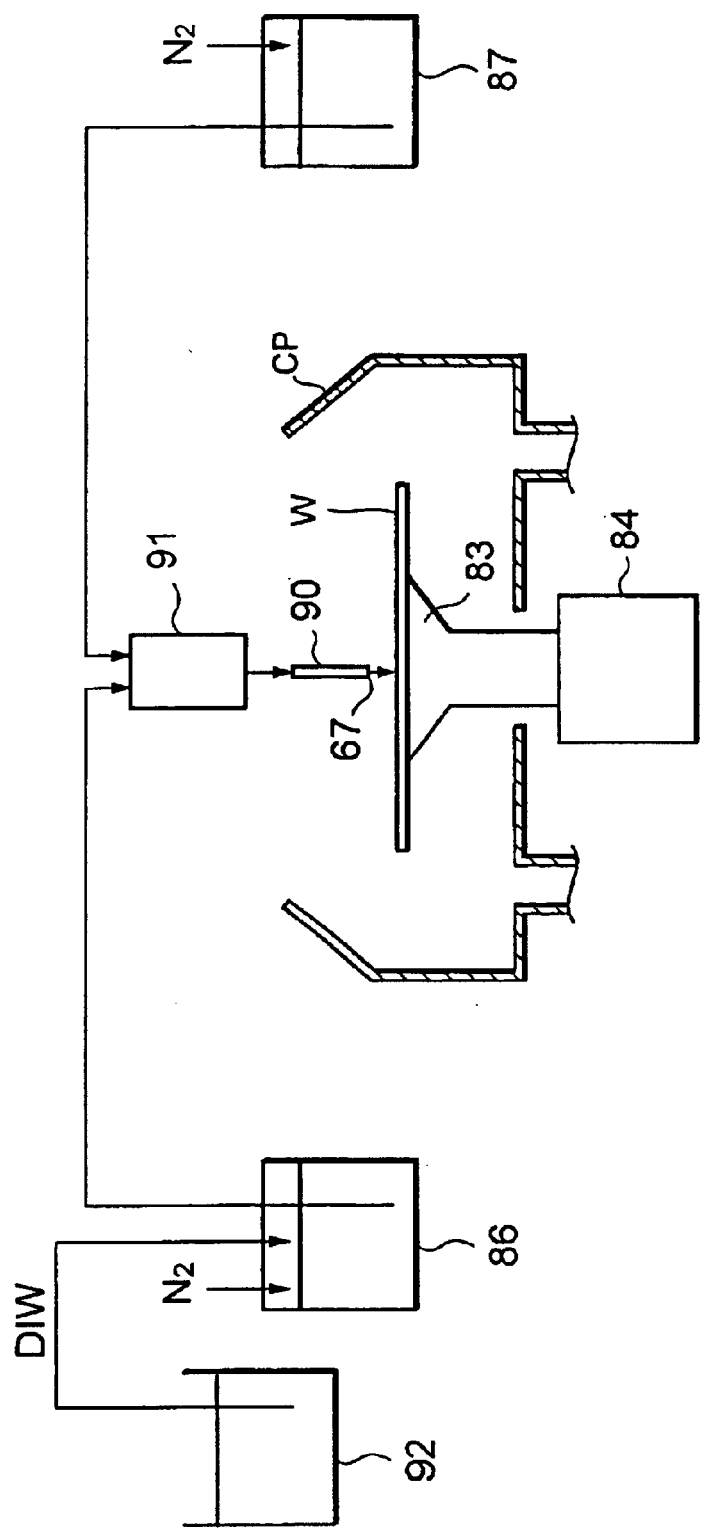
FIG. 9 is a sectional view showing yet another developing unit.

Further, as shown in FIG. 9, a temperature regulating mechanism 91 composed of a combination of a heater, a Peltier element, and the like is provided immediately before a nozzle 90, and the temperature of the mixed solution 67 is precisely controlled, whereby developing processing can be performed more precisely. Also, by providing a diluted solution supply mechanism 92 for supplying a diluted solution such as pure water to the developing solution storage vessel 86 and precisely controlling the concentration of the developing solution, the precision of developing processing can be improved.

Figure 10:
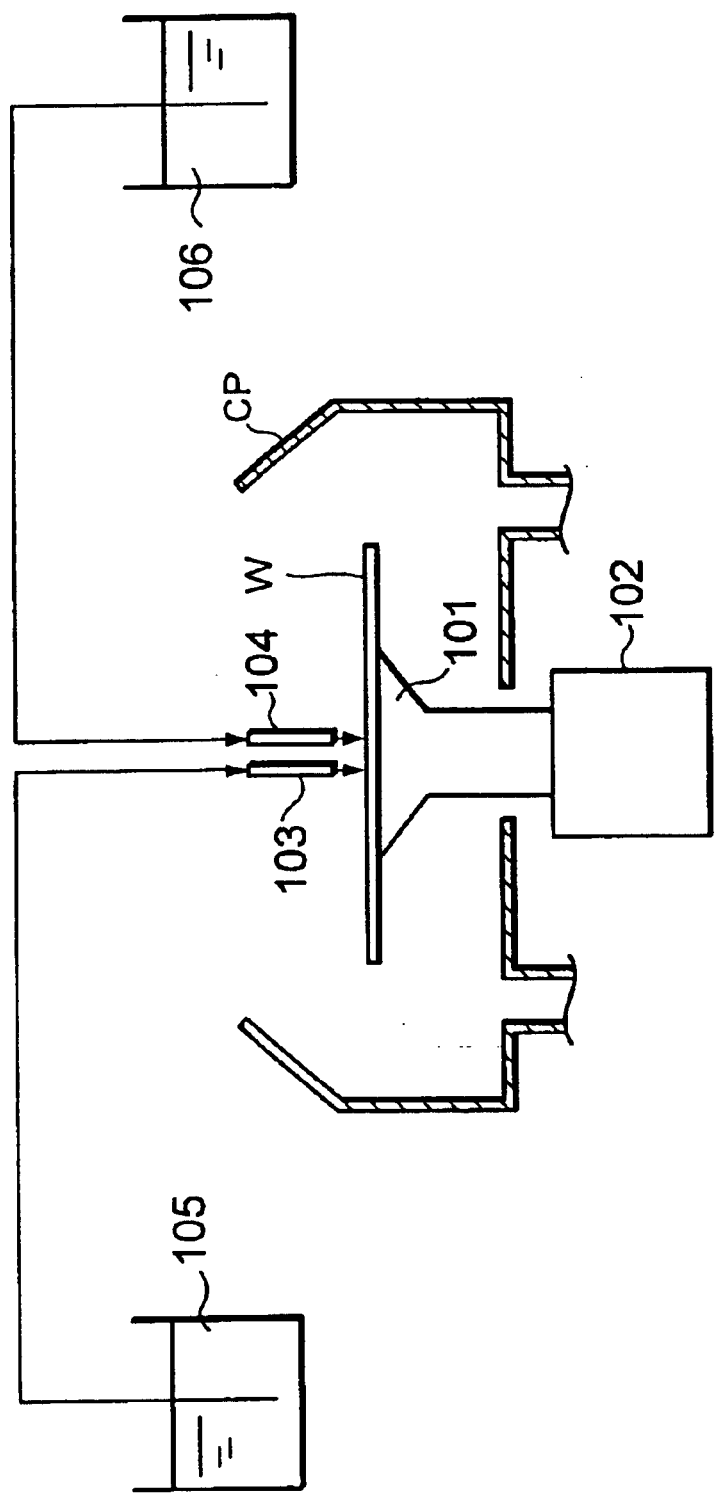
FIG. 10 is a sectional view showing an application example of the present invention to the resist coating unit.
Figure 11A:
FIG. 11A to FIG. 11D show a process flow in the resist coating unit shown in FIG. 10.
Figure 11B:
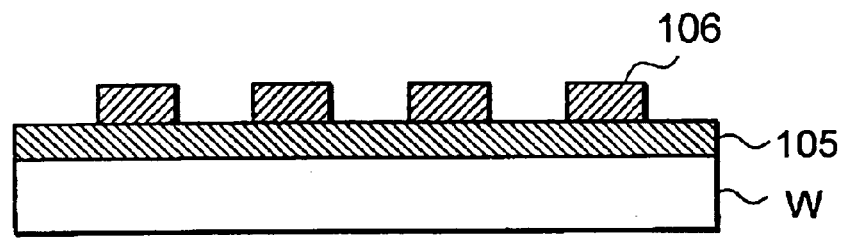
Figure 11C:
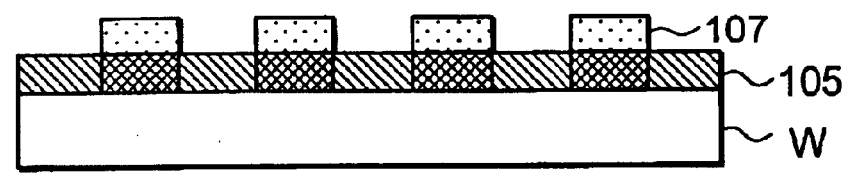
Figure 11D:
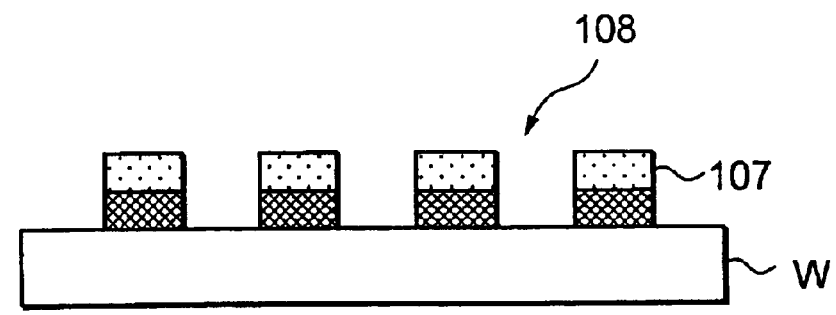

A basic concept of the present invention can be applied to resist coating processing. In this case, for example, as shown in FIG. 10, the resist coating unit (COT) has a cup CP, a spin chuck 101 for horizontally suction-holding the wafer W in the cup CP, a motor 102 for rotating the spin chuck 101, a first nozzle 103 for supplying a resist solution 105 composed of a mixture of a predetermined resin (resist) and a volatile solvent such as a thinner, and a second nozzle 104 for supplying a solvent 106 which chemically bonds with the volatile solvent. As shown in FIG. 11A, the resist solution 105 is spread over the entire surface of the wafer W by rotating the spin chuck 101 and the suction-held wafer W by means of the motor 102 while supplying the resist solution to the center of the wafer W from the first nozzle 103. Then, as shown in FIG. 11B, the solvent 106 is supplied thereto from the second nozzle 104 so as to correspond to a wiring pattern. In order to supply the solvent 106 so as to correspond to the wiring pattern, for example, the second nozzle 104 may be moved like an ink jet printer head, or the solvent 106 may be supplied through a mask. Thus, after a predetermined period of time, a resin 107 at a position to which the solvent is supplied corresponding to the pattern is solidified as shown in FIG. 11C. Then, as shown in FIG. 1D, by thermal processing, liquids at remaining portions are removed, and a desired resist pattern 108 is formed.

In the present invention, the substrate is not limited to the semiconductor wafer. The present invention can be applied to various substrates such as an LCD substrate, a glass substrate, a CD substrate, a photo mask, and a printed board.

As explained above, according to the present invention, on the occasion of developing processing, the mixed solution produced by stirring the developing solution and the solution with a specific gravity smaller than the developing solution is supplied to the front surface of the wafer W, whereby immediately after the supply of the mixed solution, in the mixed solution in a state in which bubbles of the developing solution are evenly dispersed in the solution, a chemical reaction between the developing solution and the resist rarely occurs, and developing does not progress practically. After being supplied onto the wafer W, the mixed solution is left as it is for a fixed period of time, whereby the mixed solution is separated into two layers of which the lower layer is the developing solution and the upper layer is the solution. In this point of time, the developing solution completely spreads uniformly over the entire surface of the wafer W, and developing progresses under this situation. Thus, the developing progresses in the entire surface of the wafer W all at once. As a result, time difference in start time of developing does not occur in the surface of the wafer W, thereby enabling uniform developing and an improvement in line width uniformity (CD value uniformity) in the surface of the wafer W.

Next, another embodiment of the present invention will be explained.

As described above, coating of the developing solution can be performed, for example, by a spin-coating method, and in this spin-coating method, the developing solution is spread by centrifugal force by dropping the developing solution into the vicinity of the center of the wafer and rotating the wafer. After the entire surface of the wafer W is coated with the developing solution, a rinse solution is dropped into the vicinity of the center of the wafer and spread, thereby removing the developing solution on the wafer.

In the case of such coating of the developing solution, the central portion of the wafer to which the developing solution is dropped is coated with the new developing solution, while the peripheral edge portion of the wafer is coated with the developing solution containing the developing solution already used for developing processing. Therefore, the central portion and the peripheral edge portion of the wafer differ in developing processing capability, and hence it is difficult to uniformly perform developing processing in the surface of the wafer.

Accordingly, an object of an embodiment shown below is to always supply a new processing solution onto a substrate to be processed and process the entire surface of the substrate with a developing solution having high developing processing capability.

Figure 12:
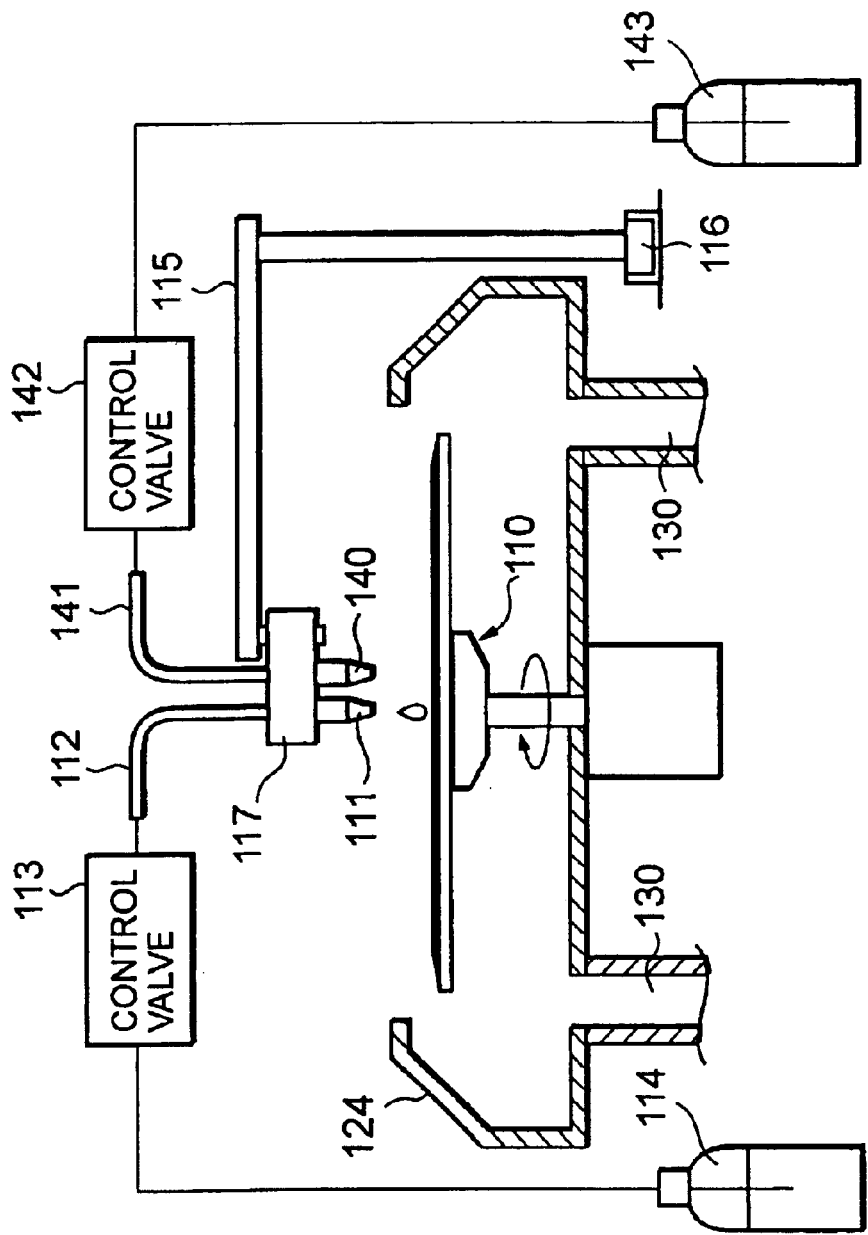
FIG. 12 is a schematic structural view showing a cleaning processing apparatus according to another embodiment of the present invention.
Figure 13:
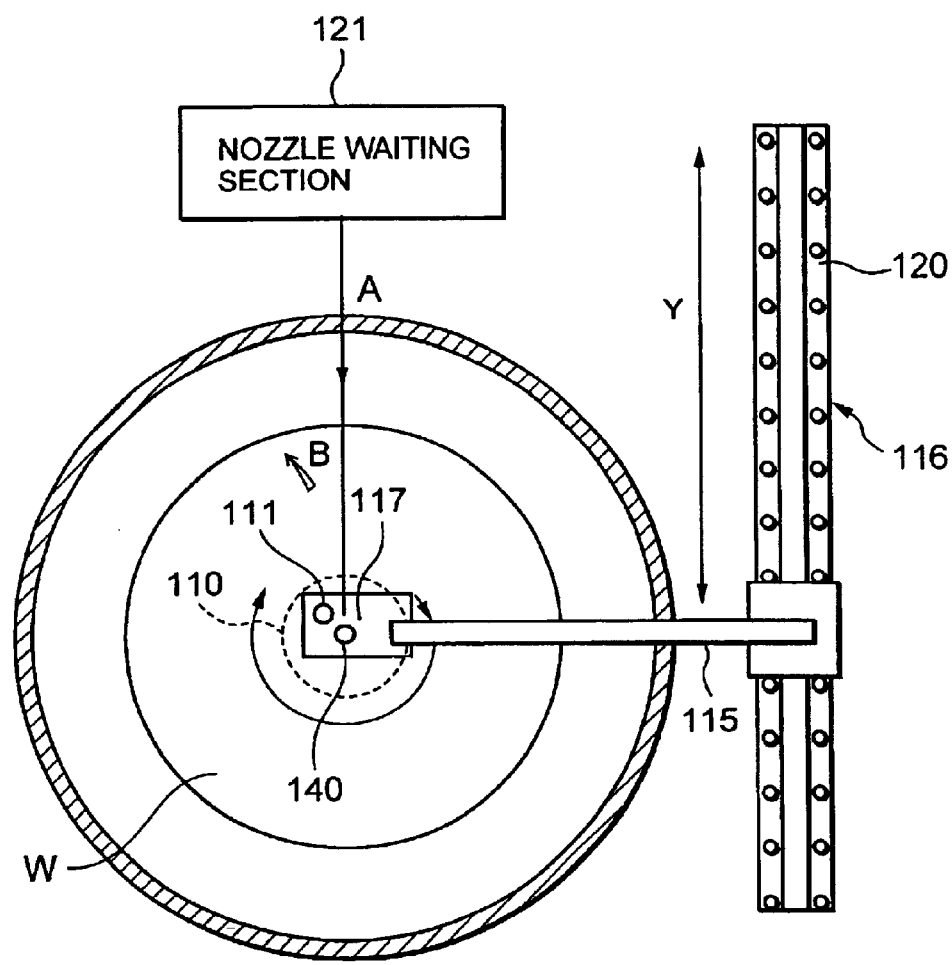
FIG. 13 is a top view of the cleaning processing apparatus in FIG. 12.

FIG. 12 is a schematic structural view showing an example in which the present invention is applied to a cleaning processing apparatus for supplying a cleaning solution as a processing solution to the front surface of the wafer W. FIG. 13 is a plan view of this apparatus from above.

Figure 14:
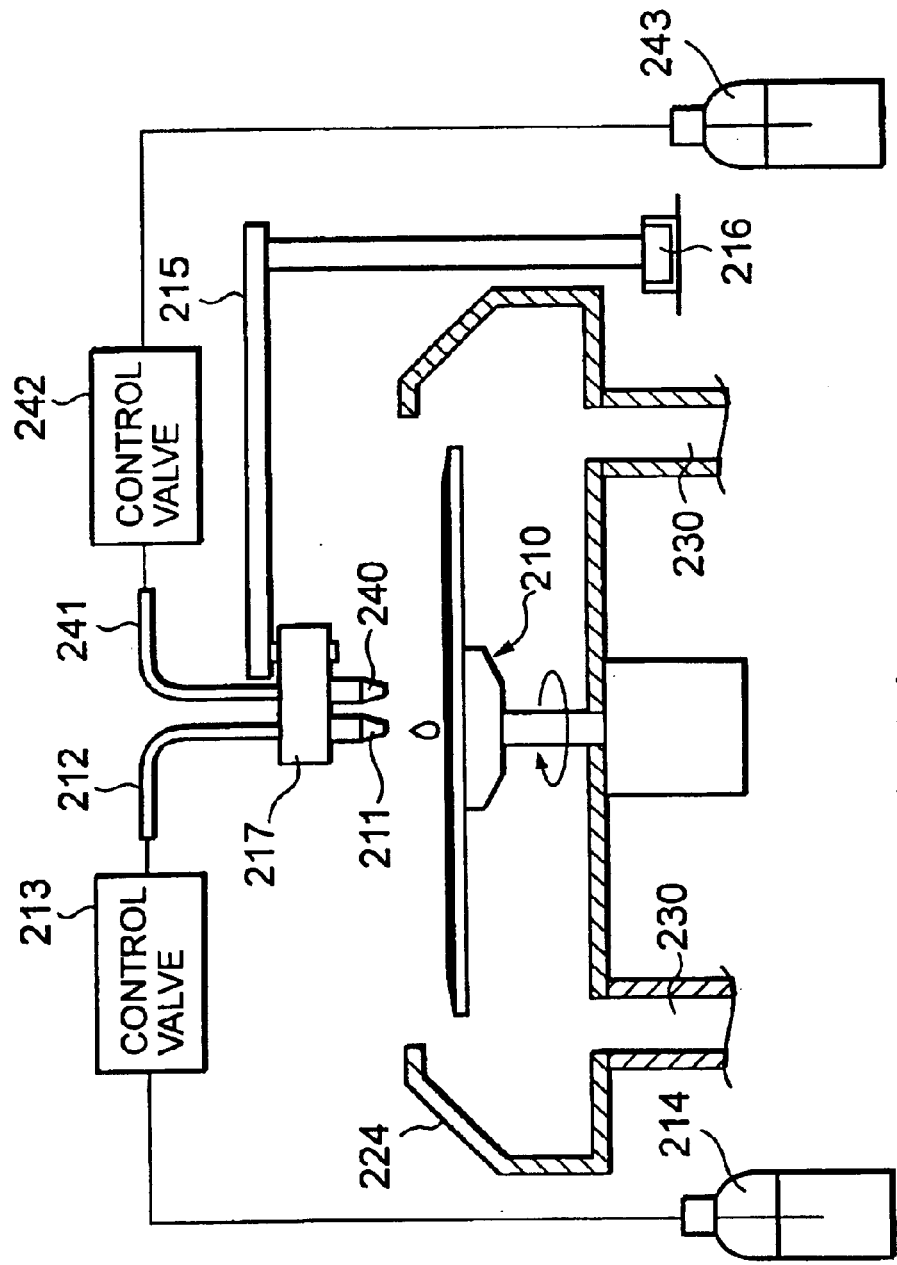
FIG. 14 is a schematic structural view showing a developing processing apparatus according to the aforesaid another embodiment of the present invention.
Figure 15:
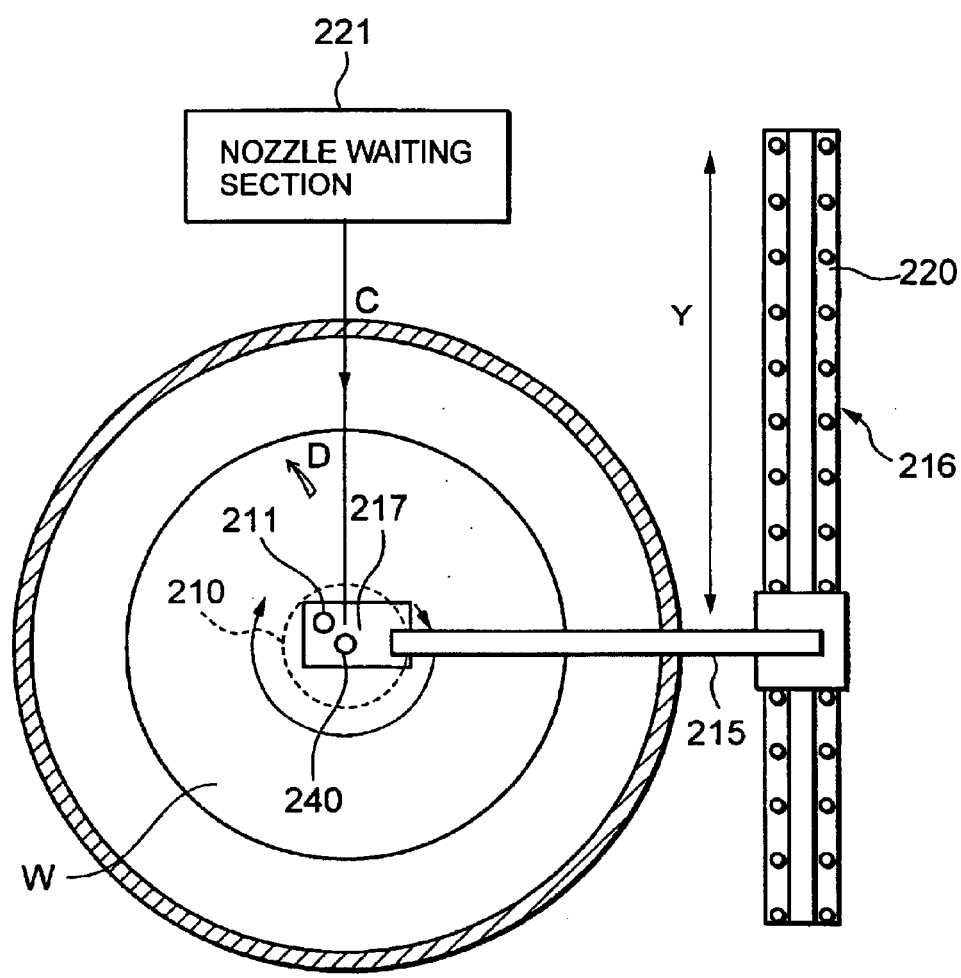
FIG. 15 is a top view of the developing processing apparatus in FIG. 14.

FIG. 14 is a schematic structural view showing an example in which the present invention is applied to a developing processing apparatus for supplying a developing solution as a processing solution to the front surface of the wafer W. FIG. 15 is a plan view of this apparatus from above.

As shown in FIG. 12, the cleaning processing apparatus has a spin chuck 110 as a substrate holding mechanism for horizontally suction-holding the wafer W on its top face and for rotating, and raising and lowering the wafer W. A cleaning solution supply nozzle 140 for dropping a cleaning solution onto the wafer W and a rinse solution supply nozzle 111 for dropping pure water as a rinse solution are disposed adjacent to each other above the spin chuck 110 and held to be able to face the wafer W. The cleaning solution supply nozzle 140 is connected to a cleaning solution tank 143 via a supply pipe 141 and a control valve 142 such as an air-operated valve or an electromagnetic valve. The rinse solution supply nozzle 111 is connected to a rinse solution tank 114 via a supply pipe 112 and a control valve 113 such as an air-operated valve or an electromagnetic valve.

The cleaning solution supply nozzle 140 and the rinse solution supply nozzle 111 are held at the tip of an L-shaped Z-drive mechanism 115 via a holder 117 as illustrated. A base end portion of the Z-drive mechanism 115 is held by a Y-drive mechanism 116. As shown in FIG. 13, this Y-drive mechanism 116 has Y-rails 120 extending to the outside of a cup 124 along a Y-direction, and can move the cleaning solution supply nozzle 140 and the rinse solution supply nozzle 111 between a position above the wafer W and a nozzle waiting section 121. This nozzle waiting section 121 is structured to be able to house the cleaning solution supply nozzle 140 and the rinse solution supply nozzle 111 and to be able to clean the tip portions of these nozzles.

As shown in FIG. 13, the cleaning solution supply nozzle 140 and the rinse solution supply nozzle 111 move along a direction in which the outer edge portion and the central portion of the wafer W are linked, that is, along the direction of an arrow A along the radius of the wafer W. The cleaning solution supply nozzle moves so as to be always positioned on the arrow A, while the rinse solution supply nozzle 111 is positioned slightly off the arrow A behind the cleaning solution supply nozzle 140 as seen from the direction of movement (the direction of the arrow). The position of the rinse solution supply nozzle 111 is fixed according to the spreading direction of the dropped cleaning solution (an arrow B), and it is recommended that its position be fixed so that the rinse solution is at least supplied to a region on which the cleaning solution dropped onto the wafer W is spread. Incidentally, the coating of the cleaning solution is performed by the rotation of the wafer W and the movement of the nozzle, and the spreading direction of the cleaning solution is fixed by the rotation direction of the wafer W.

Moreover, the cup 124 for catching the excessive cleaning solution scattered while the wafer W is rotationally driven is provided to surround the spin chuck 110.

As shown in FIG. 14, the developing processing apparatus has the same structure as the aforesaid cleaning processing apparatus, but differs therefrom in a solution to be supplied from a nozzle. The developing processing apparatus has a spin chuck 210 as a substrate holding mechanism for horizontally suction-holding the wafer W on its top face and for rotating, and raising and lowering the wafer W. A developing solution supply nozzle 240 for dropping a developing solution onto the wafer W and a rinse solution supply nozzle 211 for dropping pure water, for example, as a rinse solution are disposed above the spin chuck 210 and held to be able to face the wafer W. It is preferable that the distance between the developing solution supply nozzle 240 and the rinse solution supply nozzle 211 be as short as possible, for example, about 1 mm or less. Moreover, it is preferable that the distance between the developing solution supply nozzle 240 and the rinse solution supply nozzle 211, and the wafer W be about 5 mm to 10 mm. If it is 5 mm or less, waves occur on the surface of the solution to cause a shadow pattern under the influence of the down flow of clean air supplied into the system. The developing solution supply nozzle 240 is connected to a developing solution tank 243 via a supply pipe 241 and a control valve 242. The rinse solution supply nozzle 211 is connected to a rinse solution tank 214 via a supply pipe 212 and a control valve 213 such as an air-operated valve or an electromagnetic valve. Incidentally, it is preferable that the amount of the rinse solution to be supplied from the rinse solution supply nozzle 221 be larger than that of the developing solution to be supplied from the developing solution supply nozzle 240. As will be described later, a fresher developing solution comes to touch the surface of the wafer W.

The developing solution supply nozzle 240 and the rinse solution supply nozzle 211 are held at the tip of an L-shaped Z-drive mechanism 215 via a holder 217 as illustrated. A base end portion of the Z-drive mechanism 215 is held by a Y-drive mechanism 216. As shown in FIG. 15, this Y-drive mechanism 216 has Y-rails 220 extending to the outside of a cup 224 along the Y-direction, and can move the developing solution supply nozzle 240 and the rinse solution supply nozzle 211 between a position above the wafer W and a nozzle waiting section 221. This nozzle waiting section 221 is structured to be able to house the developing solution supply nozzle 240 and the rinse solution supply nozzle 211 and to be able to clean the tip portions of these nozzles.

As shown in FIG. 15, the developing solution supply nozzle 240 and the rinse solution supply nozzle 211 move along a direction in which the outer edge portion and the central portion of the wafer W are linked, that is, along the direction of an arrow C along the radius of the wafer W. The developing solution supply nozzle 240 moves so as to be always positioned on the arrow C, while the rinse solution supply nozzle 211 is positioned slightly off the arrow C behind the developing solution supply nozzle 240 as seen from the direction of movement (the direction of the arrow). The position of the rinse solution supply nozzle 211 is fixed according to the spreading direction of the dropped cleaning solution (an arrow D), and it is recommended that its position be fixed so that the rinse solution is at least supplied to a region on which the developing solution dropped onto the wafer W is spread. Incidentally, the coating of the developing solution is performed by the rotation of the wafer W and the movement of the nozzle, and the spreading direction of the developing solution is fixed by the rotation direction of the wafer W.

Moreover, the cup 224 for catching the excessive developing solution scattered while the wafer W is rotationally driven is provided to surround the spin chuck 210.

According to the cleaning processing apparatus of this embodiment, the rinse solution is supplied immediately after the cleaning solution is dropped onto the wafer W in a cleaning process. This rinse solution instantly removes the used dirty cleaning solution, whereby a new cleaning solution is always supplied onto the wafer W. Accordingly, the entire surface of the wafer W is cleaned by the new cleaning solution, resulting in the elimination of unevenness of cleaning in the surface and very high cleanability.

According to the developing processing apparatus of this embodiment, the rinse solution is supplied immediately after the developing solution is dropped onto the wafer W in a developing process. This rinse solution instantly removes the used dirty developing solution, whereby a new developing solution is always supplied onto the wafer W. Accordingly, the entire surface of the wafer W is developed by the new developing solution, resulting in the elimination of unevenness of developing in the surface and very high developing capability.

The aforesaid developing processing apparatus can be used in the coating and developing processing system shown in FIG. 1 to FIG. 3. The aforesaid cleaning processing apparatus is used in a cleaning before carrying in process in which the wafer W is cleaned before being carried into this coating and developing processing system.

A method of processing the wafer W in each processing apparatus will be explained below.

First, the wafer W is carried into the aforesaid cleaning processing apparatus shown in FIG. 12. The wafer W is horizontally suction-held with the surface on which an exposure pattern is formed in the coating and developing processing system facing upward by the spin chuck 110.

Subsequently, as shown in FIG. 13, while the wafer W is being rotated clockwise, the cleaning solution supply nozzle 140 and the rinse solution supply nozzle 111 are moved along the direction of the arrow A by driving the Y-drive mechanism 116 from the outer edge portion to the central portion of the wafer W while the cleaning solution and the rinse solution are supplied onto the wafer W at the same time. Thereby, the wafer W can be cleaned by the cleaning solution, and the cleaning solution can be rinsed. On this occasion, the rotation speed of the wafer W is set at a constant speed, and the moving speed of the nozzles is set to gradually decrease as the nozzles get closer to the central portion of the wafer W. As a result, the amount of the cleaning solution to be supplied can be made uniform in the surface of the wafer. Specifically, when the wafer W with a diameter of 200 mm is processed, the rotation speed of the wafer W is set, for example, at 10 rpm to 200 rpm and more preferably at 30 rpm to 150 rpm, and the moving speed of the nozzles is set, for example, at 30 mm/s at the start and set to gradually decrease at a constant rate to, for example, 5 mm/s in the vicinity of the central portion of the wafer W. Incidentally, it is also suitable to set the moving speed of the nozzles at a constant speed and change the rotation speed of the wafer W. It is recommended that the moving speed of the nozzles be set to become slower with respect to the rotation speed of the wafer W as the positions of the nozzles get closer to the central portion of the wafer W.

Next, in the developing processing apparatus, the wafer W is horizontally suction-held by the spin chuck 210. Subsequently, as shown in FIG. 15, while the wafer W is being rotated clockwise, the developing solution supply nozzle 240 and the rinse solution supply nozzle 211 are moved along the direction of the arrow C by driving the Y-drive mechanism 216 from the outer edge portion to the central portion of the wafer W while the developing solution and the rinse solution are supplied onto the wafer W at the same time. Thereby, developing and rinsing are performed. On this occasion, the rotation speed of the wafer W is set at a constant speed, and the moving speed of the nozzles is set to gradually decrease as the nozzles get closer to the central portion of the wafer W. As a result, the completion time of developing processing can be made uniform in the surface of the wafer W. Specifically, when the wafer W with a diameter of 200 mm is processed, the rotation speed of the wafer W is set, for example, at 10 rpm to 200 rpm and more preferably at 30 rpm to 150 rpm, and the moving speed of the nozzles is set, for example, at 30 mm/s at the start and set to gradually decrease at a constant rate to, for example, 5 mm/s in the vicinity of the central portion of the wafer W. Incidentally, it is also suitable to set the moving speed of the nozzles at a constant speed and change the rotation speed of the wafer W. It is recommended that the moving speed of the nozzles be set to become slower with respect to the rotation speed of the wafer W as the positions of the nozzles get closer to the central portion of the wafer W. Furthermore, in this embodiment, the moving speed of the nozzles with respect to the rotation speed of the wafer W is set to become slower relative to the moving speed of the nozzles with respect to the rotation speed of the wafer W when the nozzles are situated in the vicinity of the peripheral edge portion of the wafer W as the positions of the nozzles get closer to the central portion of the wafer W, whereby the completion time of developing processing can be made uniform in the surface of the wafer W. It is also suitable that the moving speed of the nozzles be set to increase as the positions of the nozzles get closer to the central portion of the wafer W. In this case, for example, by setting the rotation speed of the wafer W at a constant speed and increasing the moving speed of the nozzles as the positions of the nozzles get closer to the central portion of the wafer W, the contact time of the wafer W and the developing solution can be made uniform in the surface of the wafer W. This is because the coating region becomes smaller in terms of area as the positions of the nozzles get closer to the central portion of the wafer W.

Figure 18A:
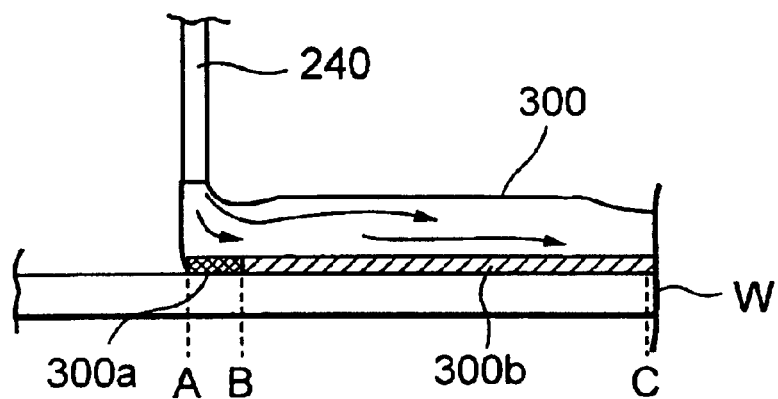
FIG. 18A is a diagram showing a conventional coating state of a developing solution.
Figure 18B:
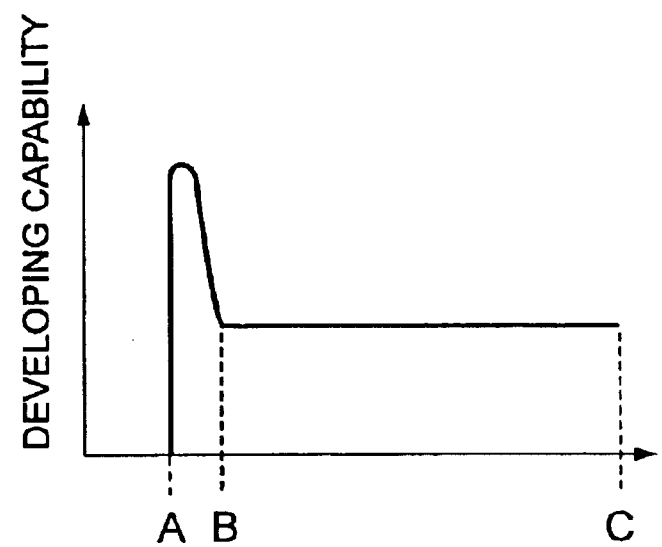
FIG. 18B is a diagram showing the relationship between the drop position of the developing solution and the developing capability of the developing solution.
Figure 19A:
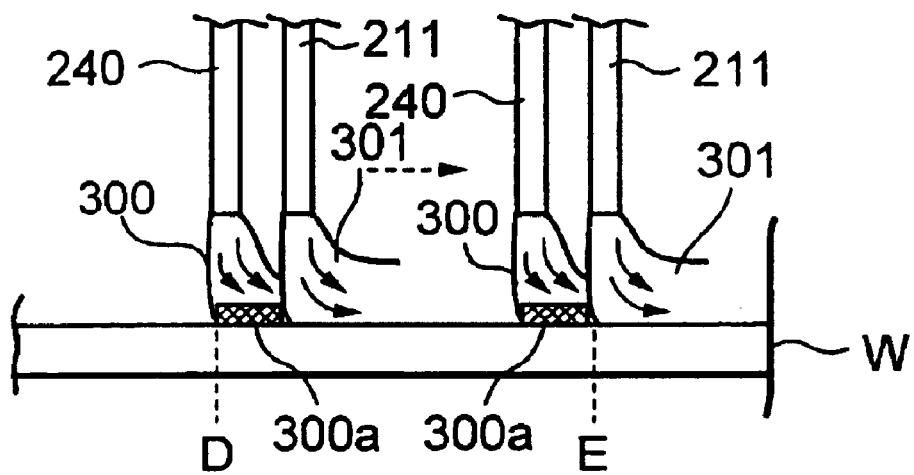
FIG. 19A is a diagram showing a coating state of a developing solution in the one embodiment.
Figure 19B:
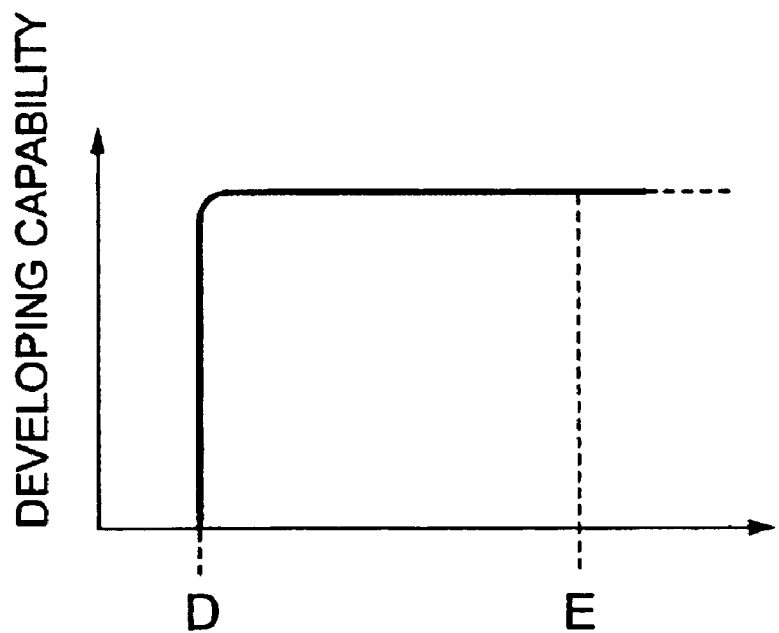
FIG. 19B is a diagram showing the relationship between the drop position of the developing solution and the developing capability of the developing solution.

Now, the effects of cleaning processing and developing processing by the cleaning processing apparatus and the developing processing apparatus in this embodiment will be explained with the developing processing apparatus as the example thereof by means of FIGS. 18A and 18B and FIGS. 19A and 19B. FIGS. 18A and 18B are diagrams showing a conventional embodiment, and FIGS. 19A and 19B are diagrams showing this embodiment. FIG. 18A is a diagram showing a state in which a developing solution 300 is applied onto the wafer W. In FIG. 18B, the horizontal axis shows a position on the wafer W corresponding to FIG. 18A, and the vertical axis shows the developing capability of the developing solution at the position on the wafer W. FIG. 19A is a diagram showing a state in which the developing solution 300 and a rinse solution 301 are applied onto the wafer W. In FIG. 19B, the horizontal axis shows a position on the wafer W corresponding to FIG. 19A, and the vertical axis shows the developing capability of the developing solution at the position on the wafer W.

Hitherto, the rinse solution is supplied after the developing solution is supplied to the entire surface of the wafer W. As shown in FIGS. 18A and 18B, since a developing solution 300a which has been just dropped by the developing solution supply nozzle 240 is new, developing processing within a region A-B is performed by the new developing solution. Meanwhile, in a region B-C, a dirty developing solution 300b which is already used for developing processing in the region A-B is spread and comes into contact with the surface of the wafer W. As a result, the developing processing capability of the developing solution 300b in the region B-C is remarkably lower compared with that of the developing solution 300a in the region A-B.

Meanwhile, in this embodiment, the dirty developing solution which is already used for developing processing is removed by the rinse solution, and hence the new developing solution is always supplied onto the wafer W. Namely, as shown in FIG. 19A, the developing solution 300a which has been just dropped by the developing solution supply nozzle 240 is new, and a region into which the developing solution is dropped is subjected to developing processing by the new developing solution. Moreover, the developing solution which is already used for developing processing is immediately removed by the rinse solution 301, and hence the new developing solution 300a is always supplied onto the wafer W by the movement of the nozzles and the rotation of wafer W. Accordingly, as shown in FIG. 19B, the new developing solution is always supplied to a region D-E, resulting in the acquisition of high developing processing capability in the surface of the wafer W. This effect applies to the cleaning processing apparatus, and a new cleaning solution is always supplied to the entire surface of the wafer W in the cleaning processing apparatus.

Figure 16:
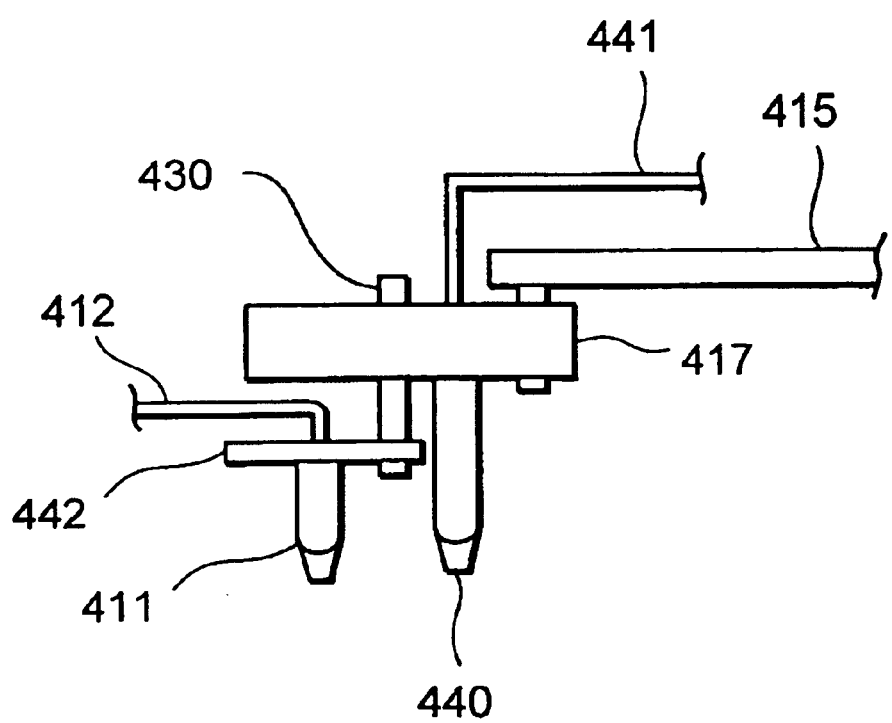
FIG. 16 is a side view showing the structure of a nozzle according to still another embodiment.
Figure 17:
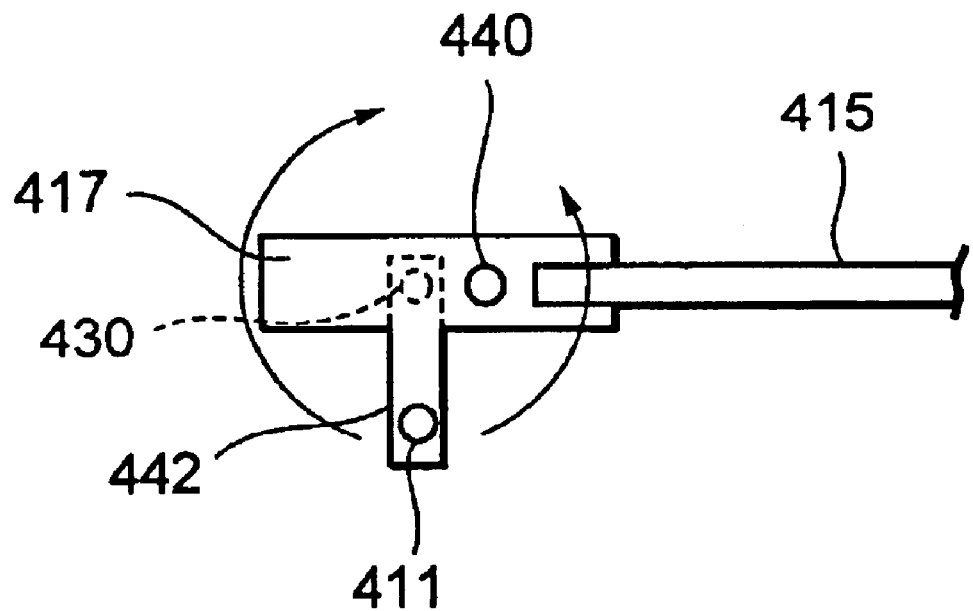
FIG. 17 is a top view of FIG. 16.

In the aforesaid embodiments, the positional relationship between the cleaning solution supply nozzle as a processing solution supply nozzle and the rinse solution supply nozzle and the positional relationship between the developing solution supply nozzle as the processing solution supply nozzle and the rinse solution supply nozzle are respectively fixed, but the positional relationship between the processing solution nozzle and the rinse solution nozzle may be set to be variable. For example, as shown in FIG. 16 and FIG. 17, the position of a rinse solution supply nozzle 441 can be set to be variable with respect to a processing solution supply nozzle 440. Incidentally, FIG. 16 is a side view of a surrounding portion of the nozzles, and FIG. 17 is a plan view showing a case where the nozzles in FIG. 16 are seen from above. A Z-drive mechanism 415 corresponds to the Z-drive mechanism 115 or 215 in the aforesaid embodiments.

As shown in FIG. 16 and FIG. 17, the processing solution supply nozzle 440 is held at the tip of the Z-drive mechanism 415 via a holder 417. The rinse solution supply nozzle 411 is held by a holder 442 connected to the holder 417 with a shaft 430. The processing solution supply nozzle 440 and the rinse solution supply nozzle 411 are connected respectively to a processing solution tank and a rinse solution tank which are not illustrated by supply pipes 441 and 412. The holder 442 is set to be rotatable 360 degrees around the shaft 430 as shown in FIG. 17. Thanks to such a structure, the position of the rinse solution supply nozzle can be set optionally with respect to the processing solution supply nozzle, whereby the position of the rinse solution supply nozzle can be set at a desirable position according to the spreading state of the processing solution dropped onto the wafer W. Moreover, this position setting can be performed while the nozzles move over the wafer W. Furthermore, a structure capable of optionally setting the distance between the processing solution supply nozzle and the rinse solution supply nozzle is added to the structure shown in FIG. 16 and FIG. 17, whereby the range of design including the rotation speed of the wafer W and the moving speed of the nozzles is further widened.

Although the nozzles move on the radius of the wafer W only one way in the aforesaid embodiments, they may move there and back on the radius of the wafer W, or may move on the diameter of the wafer W. When the nozzles move on the diameter of the wafer W, it is necessary to change the position of the rinse solution supply nozzle at the central portion of the wafer W, and such setting that the rinse solution supply nozzle is positioned in the spreading direction of the processing solution dropped from the processing solution supply nozzle may be performed.

Figure 20:
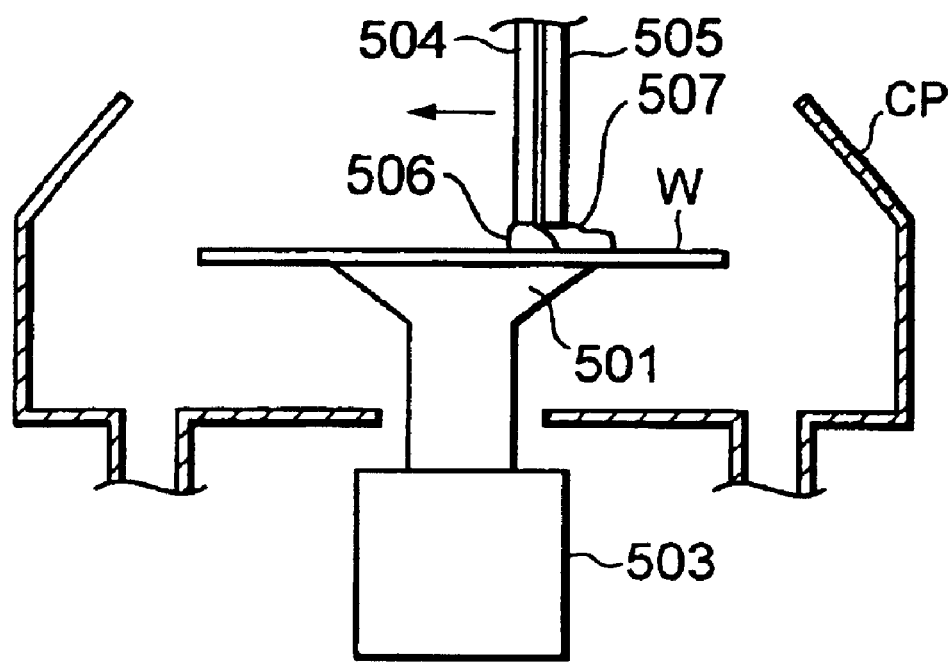
FIG. 20 is a schematic sectional view of a resist coating apparatus according to another embodiment of the present invention.

In the aforesaid embodiments, the examples in which the present invention is applied to cleaning processing and developing processing are shown, but the present invention can be applied to a resist coating apparatus as shown in FIG. 20. The resist coating apparatus shown in FIG. 20 has a cup CP, a spin chuck 501 for horizontally suction-holding the wafer W inside the cup CP, a motor 503 for rotating the spin chuck 501, a first nozzle 504 for supplying a coating solution 506 such as a resist solution, and a second nozzle 505 for supplying a solvent 507 such as a thinner. Similarly to the aforesaid embodiments, the first nozzle 504 and the second nozzle 505 are close to each other. A resist solution is spread over the entire surface of the wafer W by rotating the spin chuck 501 and the suction-held wafer W by means of the motor 503 while moving the first nozzle 504 and the second nozzle 505 and simultaneously supplying the resist solution and a thinner to the wafer W, thereby forming a resist film. On this occasion, the thinner is always supplied from the second nozzle 505 immediately after the resist solution supplied from the first nozzle 504. Consequently, the fresh resist solution is always supplied to the wafer W, whereby a thinner resist film can be formed.

Figure 21:
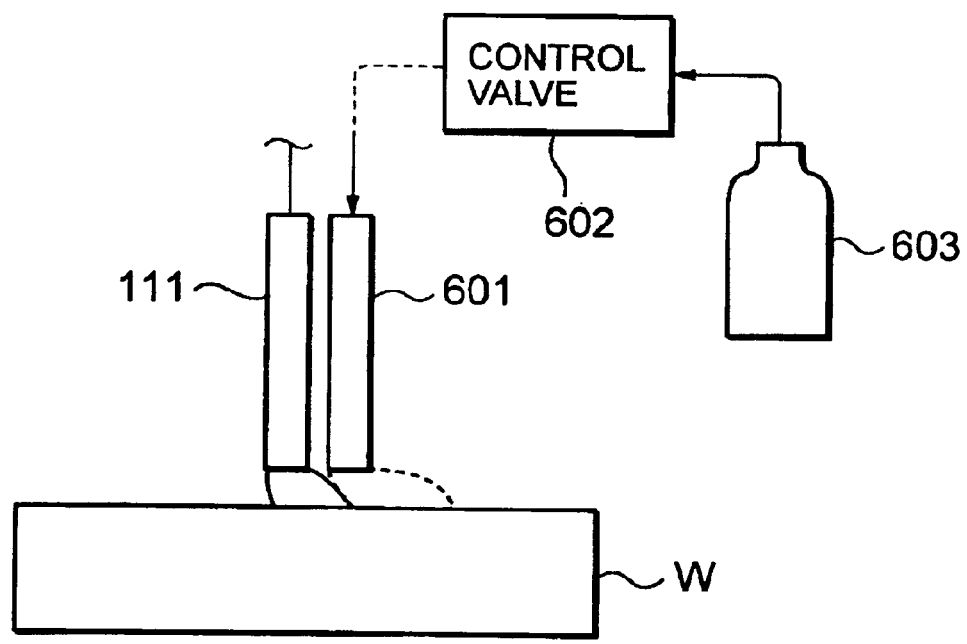
FIG. 21 is a schematic sectional view of a cleaning processing apparatus according to another embodiment of the present invention.

The rinse solution is supplied immediately after the cleaning solution in the cleaning processing apparatus shown in FIG. 12 and FIG. 13, but as shown in FIG. 21, a gas supply nozzle 601 is provided in place of the rinse solution supply nozzle, and a gas tank 603 in which a gas is stored is connected to the nozzle 601 via a control valve 602. An inert gas such as N2 gas or Ar gas is desirable as the gas. Similarly to the cleaning processing apparatus shown in FIG. 12 and FIG. 13, the gas is supplied immediately after the cleaning solution, whereby not only the same effect as in the case where the rinse solution is used can be obtained, but also dust can be effectively removed by this gas.

Figure 22:
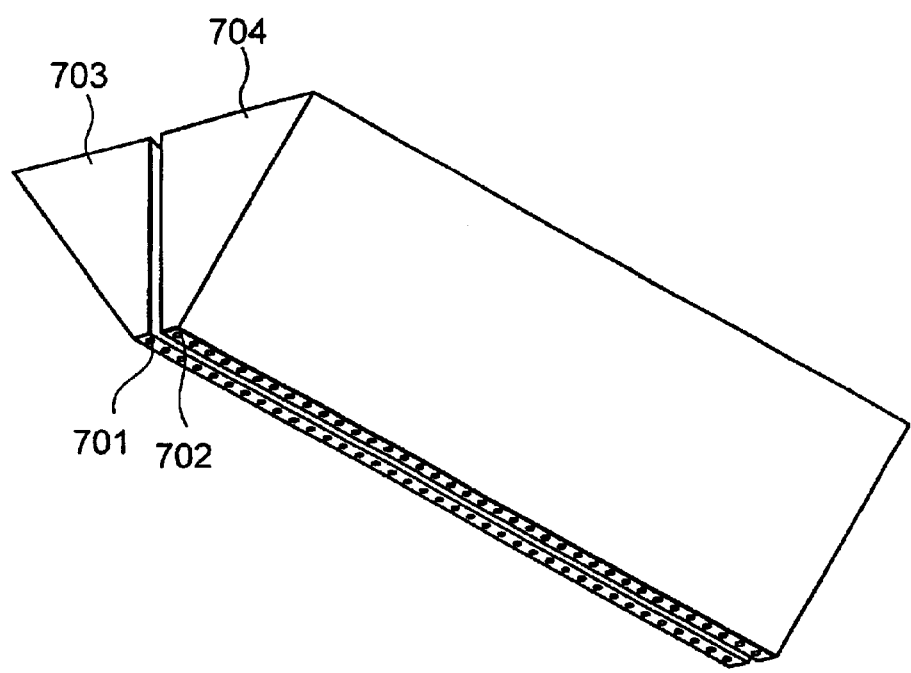
FIG. 22 is a perspective view of a scan nozzle capable of being used in the present invention.

Furthermore, in addition to the nozzles in the aforesaid embodiments, for example, as shown in FIG. 22, a scan nozzle 703 for supplying the developing solution and a scan nozzle 704 for supplying the rinse solution which are longer than the diameter of the wafer W and have many discharge ports 701 and 702 respectively can be used. As the scan speed of the scan nozzles, about 1 mm/sec to 5 mm/sec are preferable. Incidentally, it is suitable to provide a slit in place of the discharge ports. Such nozzles can be naturally applied to cleaning and resist coating.

This embodiment can be modified variously otherwise without departing from the spirit of the present invention. For example, the aforesaid embodiments are explained with the developing processing apparatus for supplying the developing solution to the semiconductor wafer as one example, but the substrate is not limited to the semiconductor wafer, and an apparatus for applying a developing solution to a rectangular glass substrate used for LCD fabrication is also possible. Also regarding the aforesaid cleaning processing apparatus, it can be used in the process of cleaning the rectangular glass substrate used for LCD fabrication. Although the developing solution and the cleaning solution are shown as examples of the processing solution in the aforesaid embodiments, a peeling solution for the resist material or the like is also available, and modification is possible.

As described above, according to the present invention, a new processing solution can be supplied to the entire surface of a substrate to be processed, whereby unevenness of processing in the surface of the substrate is eliminated, resulting in further improvement in processing capability.

The disclosure of Japanese Patent Applications No. 2000-92660 filed Mar. 30, 2000 and No. 2000-68121 filed Mar. 13, 2000, including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing method for performing predetermined processing for a front surface of a substrate using a first solution and a second solution having a specific gravity smaller than the first solution, comprising the steps of:
   (a) supplying a mixed solution in which the first solution and the second solution are mixed onto the substrate; and
   (b) allowing the mixed solution to dwell on the substrate at least until the mixed solution is separated into the first solution and the second solution on the substrate.

2. The method as set forth in claim 1,
   wherein the first solution is a developing solution and the second solution is at least one of an HMDS, a dimethylsilane, a dimethylamido, and an activator,
   the method, further comprising the steps of forming a resist film on the substrate and exposing the formed resist film in accordance with a predetermined pattern before the step (a).

3. The method as set forth in claim 1, further comprising the step of:
   mixing the first solution and the second solution before the step (a).

4. The method as set forth in claim 3,
   wherein the mixing step includes the step of stirring the mixed solution.

5. The method as set forth in claim 1, further comprising the step of:
   regulating a temperature of the mixed solution before the step (a).

6. The method as set forth in claim 1, further comprising the step of:
   regulating a concentration of the developing solution before the step (a).

7. A substrate processing method for developing an exposure pattern after a resist film formed on a substrate is exposed in accordance with a predetermined pattern, comprising the steps of:
   stirring a developing solution and a first solution with a specific gravity smaller than the developing solution; and
   supplying the stirred developing solution and the first solution onto the exposed resist film on the substrate and allow the stirred developing solution and the first solution to dwell on to the exposed resist film on the substrate.

8. The method as set forth in claim 7,
   wherein the first solution is at least one of an HMDS, a dimethylsilane, a dimethylamido, and an activator.

9. The method as set forth in claim 7,
   wherein the resist film is formed out of a chemically amplified resist.

10. A substrate processing method, comprising the steps of:
    moving a supply position while supplying a first solution onto a substrate; and
    supplying at least one of a second solution and a gas from an adjacent position simultaneously with the first solution so as to remove the supplied first solution as the supply and adjacent positions are being moved.

11. The method as set forth in claim 10,
    wherein the first solution is a cleaning solution and the second solution is a rinse solution.

12. The method as set forth in claim 11,
    wherein the rinse solution is a pure water.

13. The method as set forth in claim 10,
    wherein the first solution is a cleaning solution and the gas is an inert gas.

14. The method as set forth in claim 10,
    wherein the first solution is a developing solution and the second solution is a rinse solution.

15. The method as set forth in claim 10,
    wherein the first solution is a resist solution and the second solution is a solvent.

16. A substrate processing method, comprising the steps of:
    rotating a substrate which is horizontally held; and
    simultaneously supplying to the rotating substrate a processing solution from a processing solution supply nozzle and a rinse solution from a rinse solution supply nozzle provided adjacent to the processing solution supply nozzle while moving the processing solution supply nozzle and the rinse solution supply nozzle along a direction in which an outer edge portion and a central portion of the substrate are linked, such that the rinse solution spreads in a direction in which the processing solution supplied on the substrate has spread.

17. A substrate processing method, comprising the steps of:

rotating a substrate which is horizontally held; and simultaneously supplying to the rotating substrate a processing solution from a processing solution supply nozzle and a rinse solution for removing the processing solution from a rinse solution supply nozzle provided adjacent to the processing solution supply nozzle while moving the processing solution supply nozzle and the rinse solution supply nozzle along a direction in which an outer edge portion and a central portion of the substrate are linked such that the processing solution supplied on the substrate is removed by the rinse solution.

18. A substrate processing method, comprising the steps of:

rotating a substrate which is horizontally held; and simultaneously supplying to the rotating substrate a processing solution from a processing solution supply nozzle and a rinse solution for removing the processing solution from a rinse solution supply nozzle provided adjacent to the processing solution supply nozzle while moving the processing solution and rinse solution supply nozzles such that the rinse solution spreads in a direction in which the processing solution supplied on the substrate has spread.

* * * * *